US006538923B1

(12) United States Patent
Parker

(10) Patent No.: US 6,538,923 B1
(45) Date of Patent: Mar. 25, 2003

(54) STAIRCASE PROGRAM VERIFY FOR MULTI-LEVEL CELL FLASH MEMORY DESIGNS

(75) Inventor: Allan Parker, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/794,482

(22) Filed: Feb. 26, 2001

(51) Int. Cl.$^7$ .......................... G11C 16/04; G11C 16/06
(52) U.S. Cl. ............................. 365/185.03; 365/185.19; 365/185.22
(58) Field of Search ..................... 365/185.03, 185.18, 365/185.19, 185.22, 185.24, 185.33

(56) References Cited

U.S. PATENT DOCUMENTS

| | | | | |
|---|---|---|---|---|
| 5,544,116 A | * | 8/1996 | Chao et al. ............. | 365/185.22 |
| 5,675,540 A | * | 10/1997 | Roohparvar ........... | 365/185.22 |
| 5,712,815 A | * | 1/1998 | Bill et al. ............... | 365/185.03 |
| 5,768,191 A | * | 6/1998 | Choi et al. ............. | 365/185.22 |
| 5,828,601 A | * | 10/1998 | Hollmer et al. ......... | 365/185.22 |
| 6,147,910 A | * | 11/2000 | Hsu et al. .............. | 365/185.22 |
| 6,304,485 B1 | * | 10/2001 | Harari et al. .......... | 365/185.22 |

* cited by examiner

Primary Examiner—Trong Phan

(57) ABSTRACT

A system for concurrently verifying programming of logical data in a multi-level-cell (MLC) flash memory device having a plurality of memory cells each configured to store N bits of logical data where $N \geq 2$. The MLC flash memory device has a plurality of memory cells capable of being storing N-bits of data in one of $2^N$ distinct data storage levels, each data storage level corresponding to a discrete N-bit combination of logical data. The data storage levels include a default level, called the erased level, and $2^N-1$ program levels, including a lowest program level, $2^N-2$ intermediate program levels and a highest program level. For each memory cell to be verified as programmed, an N-bit combination of data to be verified is loaded into a program-verify circuit and a stepped voltage pulse having $2^N-1$ steps is applied to each memory cell. The stepped voltage pulse includes an initial step, at least one intermediate step and a final step with the initial step substantially equal to a program-verify voltage for the highest program level of the MLC flash memory within a the highest program level, each successive intermediate step is substantially equal to a program-verify voltage corresponding to an intermediate program level and the final step of the voltage pulse is substantially equal to a program-verify voltage for the lowest program level. Concurrently with the application of the stepped voltage pulse to each memory cell, the data storage level is verified as substantially within a program level corresponding to the N-bit combination for the memory cell. Subsequent to verifying the data storage level for a memory cell, the verified memory cell is inhibited form further application of a program pulse.

8 Claims, 18 Drawing Sheets

STAIRCASE PROGRAM VERIFY FOR MULTI-LEVEL CELL FLASH MEMORY DESIGNS

BACKGROUND

1. Field of Invention

The present invention relates generally to the field of electronic data storage devices. More particularly, the present invention relates to non-volatile multi-level-cell semiconductor memory devices and a method for reducing program-verify time in non-volatile multi-level-cell semiconductor memory devices.

2. Description of Related Art

Many electronic devices, such as computers, personal digital assistants, cellular telephones, digital cameras and similar systems and devices include processors and memory fabricated from semiconductors. The memory is used to store computer programs to be executed by the device and/or data operated on by the processors to achieve the functionality of the device. Many devices and systems require that this information be retained in permanent storage—non-volatile medium—so that the data and computer programs remain when power is removed.

Conventional semiconductor memory devices store bits of information in memory cells. The typical memory cell comprises an access transistor and a storage element such as a capacitor. Data is represented in binary notation with a "1" or a "0," depending on the charge stored at the location. Such devices, however, require constant ambient power in order to retain the charge. Therefore, the data stored in such memory devices are susceptible to power loss.

Semiconductor memory devices that do not require ambient power to retain the data stored therein have been developed. These devices have been termed "non-volatile" semiconductor memory devices. In common designs for non-volatile semiconductor memory devices, data is internally organized in an array of sectors, each comprising a plurality of memory cells. Each sector is partitioned into segments termed a page, each page partitioned into segments termed a word, and each word partitioned into memory cells. Data is accessed for reading and programming by page, while the entire sector is accessed for erasing.

A few examples of non-volatile semiconductor memory devices include Read Only Memory (ROM), Programmable Read Only Memory (PROM), and Erasable Programmable Read Only Memory (EPROM). While conventional EPROM's provide reliable non-volatile storage, they typically may not be able to be reprogrammed in a practical matter. For example, EPROM's typically require exposure to Ultraviolet light to erase. This often requires that the device be removed from its host to be erased. In many applications, removing the memory is not practical to reprogram.

An Electrically Erasable Programmable Read Only Memory (EEPROM) is a type of EPROM. An EEPROM is similar to an EPROM, but can be electrically reprogrammed with voltage pulses and without special hardware. An EEPROM has the disadvantages of being expensive and having a relatively limited life span, according to the number of erased and write operations.

Another type memory having similar properties to of non-volatile memory devices is the Static Random Access Memory (SRAM). The SRAM offers high operating speeds but only maintains its ability to retain the information stored therein while power is supplied to it. Therefore, to retain its non-volatility properties, it requires constant power from a battery or other similar energy storage device. This necessitates additional hardware to maintain power to the SRAM, which increases manufacturing cost and complexity. Further, the additional hardware may put undesirable constraints on the physical size of the design.

Flash memory (or Flash RAM) is another form of non-volatile memory devices. Flash Memory devices involve more complex processing and testing procedures than ROM, but have the advantage of electrical programming and erasing. In addition, Flash Memory has the additional ability of electrically selectively erasing all memory cells. One characteristic of flash memory is that individual memory cells must be erased before they can be reprogrammed. Using Flash Memory devices in circuitry permits in-circuit erasing and reprogramming of the device without having to remove the memory device. The bits in a flash memory device can be modified millions of times during the lifetime of the device. Conventional flash memory devices store a single bit of data per memory cell. Each memory cell is characterized by a threshold voltage ($V_t$). Within conventional flash memory devices, two possible threshold voltages ($V_t$) exist.

FIGS. 1 and 1a show an example of a typical configuration for a conventional flash memory cell 100 in a flash memory device. A Conventional flash memory cell 100 uses a memory cell transistor 101 having a substrate 104, a source 105, a drain 106, a gate 107, and a floating gate 102 structure. A thin insulating film 103 may also be located between the floating gate 102 and the substrate 104. Data in the flash memory device are programmed or erased by accumulation or evacuation of charge a floating gate 102. Programming of the memory cell 100 occurs by applying a sufficient voltage difference to the transistor to cause excess electrons to accumulate on the floating gate 102. The accumulation of the additional electrons on the floating gate 102 raises the charge on the gate and the transistor's $V_t$. The transistor's $V_t$ is raised sufficiently above that of the applied voltage during read cycles $V_r$ so that the transistor does not conduct during the read cycles. Therefore, a programmed memory cell 100 will not carry current, representing the logical value "0."

The erasure of data in a memory cell 100 is caused by a process by which a sufficient voltage difference is applied to the memory cell transistor 101 to cause the excess electrons on the floating gate 102 in the memory cell transistor 101 to evacuate the floating gate 102. Thereby the transistor's $V_t$ is lowered below that of the voltage potential applied to the transistor to read data $V_r$. In the erased state, current can flow through the transistor. When $V_r$ is applied, the current will flow through the transistor of the memory cell 100, representing a logical value "1" stored in the memory cell 100. The granularity by which a flash memory device can be programmed or erased may vary. Granularities down to the bit level programming/erasure are contemplated.

An example of a typical configuration for an integrated circuit including a flash memory array 200 and circuitry enabling programming, erasing, and reading for memory cells in the array 200 is shown in FIG. 2. The flash memory array 200 includes individual cells 202. Each cell 202 has a drain connected to a bitline 204; each bitline 204 is connected to a bitline pull up circuit 206 and column decoder 208. The sources of the array cells are connected to $V_{ss}$, while their gates are each connected by a word-line 209 to a row decoder 210.

The row decoder 210 receives voltage signals from a power supply 212 and distributes the particular voltage signals to the word-lines as controlled by a row address received from a processor or state machine 214. Likewise, the bitline pull up circuit 206 receives voltage signals from the power supply 212 and distributes the particular voltage signals to the bitlines as controlled by a signal from the processor 214. Voltages provided by the power supply 212 are provided as controlled by signals received from processor 214.

The column decoder 208 provides signals from particular bitlines 204 to sense amplifiers or comparators 216 as controlled by a column address signal received from processor 214. The sense amplifiers 216 further receive voltage reference signals from reference circuit 218. The outputs from sense amplifiers 216 are then provided through data latches or buffers 220 to processor 214.

Programming of the flash memory array 200 is executed on a word-line basis. The word-line 209 is considered the row address. The word-line will cross multiple bit-lines 204. The bit-line 204 is considered the column address. Each bit-line 204 contains buffer logic to interface to the selected cell during program, read, and erase operations.

Flash memory devices, termed multi-level-cell (MLC) flash memory devices, have been developed. MLC flash memory designs provide for the storage of more than one bit of information within a memory cell. Whereas, a conventional memory cell depicts two data storage levels (logic states "0" and "1"), multi-level storage refers to the ability of a single memory cell to represent multiple bits of data. MLC flash memory designs make use of the analog range of threshold voltage for a conventional flash. As discussed above, the memory cell transistor can be programmed to a specified $V_t$ at any level within a range of voltages for the transistor. In MLC flash memory designs, the range in which the $V_t$ may be programmed is segmented into various levels and each segment is assigned a specific bit pattern. Specifically, multiple bits can be stored in a single transistor because the MLC memory cell can be programmed to within any one of the segmented levels, with each voltage level representing multiple bits of data. The memory cell is programmed to a specified data storage level within the range segmented for the discrete combination of bits of data to be stored by the MLC memory cell.

Tables 1, 2, and 3 show examples of data storage in conventional 1-bit memory designs, 2-bit MLC flash memory designs, and 3-bit flash memory designs. As shown in these tables, storage of "N" bits of data in MLC flash memory devices requires the threshold voltage level to be divided into $2^N$ data storage levels. (e.g. 2 bits requires 4 levels of storage.). Present MLC designs provide for the storage of as many as 256 levels. It will be appreciated, however, that MLC designs having more levels are contemplated. The number of levels that can be programmed is limited, for example, by the accuracy of the voltage detection and comparison to a threshold and the precision with which the electrons can be placed on the floating gate.

TABLE 1

Conventional Flash Memory

| Data Stored | Data Storage Level |
|---|---|
| 1 | Level E |
| 0 | Level 1 |

TABLE 2

2-Bit MLC Flash Memory

| Data Stored | Data Storage Level |
|---|---|
| 11 | Level E |
| 10 | Level 0 |
| 01 | Level 1 |
| 00 | Level 2 |

TABLE 3

3-Bit MLC Flash Memory

| Data Stored | Data Storage Level |
|---|---|
| 111 | Level E |
| 110 | Level 0 |
| 101 | Level 1 |
| 100 | Level 2 |
| 011 | Level 3 |
| 010 | Level 4 |
| 001 | Level 5 |
| 000 | Level 6 |

Allowing multiple bits of data to be programmed into a single cell in the flash memory in such designs affords storage for larger amounts of data within the same density of conventional flash memory devices which ultimately results to a significant reduction in the cost to store data. The different data storage levels can be sustained over time in a flash memory, even after repeated accesses to read data from the cell. By way of example only, as shown in Table 3, eight data storage levels provide storage for three bits of data that would ordinarily require at least three memory cells in a conventional flash memory device. Accordingly, MLC designs that stores three bits of data per cell provides three times as much data storage as a conventional memory array of the same size.

Programming data into a MLC flash memory array typically involves a complex process. The memory array is erased before it is primed for programming. In general, to program data into a flash memory array, program and verify cycles are necessary. Prior techniques required the programming and verifying cycles in series for each data storage level. During the program cycle, a program voltage, sufficient to program the memory cell at the appropriate $V_t$ level, is applied each selected memory cell to be programmed at that level. Referring again to FIG. 2, to program a MLC flash memory cell in the flash memory array 200, high gate-to-drain voltage are provided to the cell from power supply 212 while a source of the cell is grounded. By way of example, during programming typical gate voltage pulses of 18V are each applied to a cell, while a drain voltage of the cell is set to 3.3V and its source is grounded.

During the verify cycle, it is determined whether each selected memory cell is programmed at that level. When it is determined that the selected memory is not programmed according to the verify cycle, the program cycle on the selected memory cells is repeated. The program and verify cycles are repeated until it is determined that each selected memory cell is programmed according to the verify cycle.

When it is determined that each memory cell in the selected memory sector is programmed, memory cells for any remaining $V_t$ levels are selected and the program and verify cycles are performed on those memory cells. The program verify cycles are repeated until all of the data has been verified as loaded. Accordingly, MLC flash memory designs that utilize $2^N$ Vt levels to represent N bits require N−1 program verify levels to program the N logical bits, where N is a number selected from the set of positive integers.

Because the program rate varies from memory cell to memory cell, the time necessary to program each cell also varies. The program cycle extends for a sufficient time expected to program the selected memory cells and the verify cycle determines whether the program cycle was sufficient to program all selected memory cells. The program cycle is comparatively slower than the verify cycle. During the program cycle, the program voltage pulses are applied for sufficient time expected to allow the accumulation of electrons on the floating gate necessary to raise the $V_t$ level to the desired range. Programming each memory cell can take several program pulses.

After each program pulse, a verify cycle occurs. Verification is needed because of variation in program speeds among the bit-cell population. Fast bits may achieve the desired $V_t$ level in 5 program pulses. Slow bit-cells may require 10 program pulses to complete. The verification cycle guarantees that each cell is at a desired $V_t$ state. The verification cycle allows specific bits to be disabled from further programming when the desired $V_t$ level is achieved.

A memory cell that has been verified as programmed is unselected such that it is not subjected to further program cycles after it has been verified as programmed. FIG. 3 illustrates a selected and unselected bit-line during programming. The unselected memory cell (bit not to be programmed) is considered program inhibited because the bit-line is will not be subject to the effects of the program pulse. The selected memory cell (bit to be programmed) is referred to as program enabled and will be programmed during the program pulse.

As shown in FIG. 3, the program voltage $V_{pp}$ (approximately 18V) will be applied to the selected word-line (column address). A substantially lesser voltage, such as 10V, will be applied to unselected word-lines. A selected word-line will have a strong electric field generated across the memory device. In particular, FIG. 3 shows that with $V_{ss}$ (approximately 0V) being applied to one end of a bit-line to be uninhibited, the source/drain regions of the bit-line will couple to 0V or ground. This will make the applied electric field appear much stronger so that effective programming can occur. A high electric field generated across the memory device will cause electron injection towards the floating gate of the selected cell exponentially proportional to strength of the field. This programming procedure results in an increase of a $V_t$ for the memory cell to the desired level.

A program inhibited (unselected) word-line will not have a strong field across the transistor. FIG. 3 shows that with $V_{cc}$ (approximately 3.0V) being applied at one end of a bit-line to be inhibited, the source/drain regions of bit-line will couple to 8V. This will make the applied field appear much weaker and no effective programming will occur.

Each memory cell requires application of a specific electric field to obtain the desired programmed $V_t$ level. The magnitude of the electric field determines the program speed of the memory cell. Fast cells need less applied electric field while slow cells need more applied electric field. The electric field is applied through several program voltage pulses. The use of program voltage pulses allows for control program distributions. After each pulse, the cells are verified to determine whether the desired $V_t$ has been achieved. Multiple program pulses allows for program inhibiting of fast bits and prevents possible data corruption from over-programmed cells. Verifying the memory cells provides for application of the program voltage pulses to selected memory cells to raise the $V_t$ to a desired level while inhibiting application of the program voltage pulses to memory cells that are already programmed to the desired $V_t$ level.

FIG. 4a illustrates a typical distribution map of individual $V_t$ levels for a 2-bit MLC flash memory array, each cell capable of being programmed to one of four states. FIG. 4a shows the distribution of $V_t$ within each level. All memory cells start in the erased state (Level E). Depending on data, specific bits will be programmed to the higher 3 levels. Programming the memory cell to the selected level changes the state of the memory cell from the erased "11" level to any of the three other levels "10" (Level 0), "01" (Level 1), or "00" (Level 2). As shown, the memory cells programmed to store Level 1 data-bits "01" in this example have a $V_t$ value between $V_{t1}$ and $V_{t2}$. FIG. 4a illustrates a program margin between each program distribution. The program margin is selected based on the precision that the desired $V_t$ for each level can be programmed and subsequently the data stored therein read. Once programmed, the data stored can be externally read-two bits in this example.

FIG. 4b illustrates the difference between the read and verify levels (Read Margin). In FIG. 4B, the read levels for level 0 and 1 are designated "$V_{r0}$" and "$V_{r1}$", respectively, while the verify levels are $V_{vfy0}$, and $V_{vfy1}$, respectively. A verify operation is functionally the same as a read operation. The difference between the read and verify level is selected to supply a margin to compensate for reliability and functional variations (i.e. $V_{cc}$, temperature). In conventional MLC flash memory designs, verify cycles occur after each program cycle to determine if the memory has a desired $V_t$ level.

Conventional programming and verifying flows independently program each $V_t$ level. This is illustrated in FIG. 5 where programming pulses $Pg_0$, $Pg_1$, and $Pg_2$ for programming levels 0, 1, and 2, respectively, are generated. By way of example, $Pg_2$, $Pg_1$, and $Pg_0$ have values of 18V, 19V and 20V, respectively. The programming pulses each have a corresponding program verify pulse $PV_2$, $PV_1$ and $PV_0$, respectively. By way of example, the verify pulse $PV_2$ has a constant voltage of approximately 0.4V and a width of approximately 4 µs, program verify pulse $PV_1$ has a constant voltage of approximately 1.2V and a width of approximately 4 µs and program verify pulse $PV_0$ has a constant voltage of approximately 2.1V and a pulse width of approximately 4 µs. If 10 pulses are required to program each level, then programming would constitute initially applying ten of the $Pg_2$ V and $PV_2$ V pulse pairs to program level 2. Next, ten of the $Pg_1$ V and $PV_1$ V pulse pairs are applied to program level 1. Finally, ten of the $Pg_0$ V and $PV_0$ pulse pairs are applied to program level 0. Thus, the total program time would take the time elapsed for 30 program pulses and 30 program-verify pulses.

A multi-level-cell 202 utilizes $2^N$ $V_t$ levels to represent N logical bits. Standard program times of MLC designs are $2^N-1$ times that of a single bit program time (SBPT). Again, a known programming distribution of $V_t$ for two logical bits (N=2) in a single multi-level-cell 202 is shown in FIG. 4. In particular, four programming charge distributions E, 2, 1 and 0 are formed. All cells start in the erased state—Level E in this example. Therefore, only Levels 2, 1, and 0 need to be programmed. The centers of the programming charge distributions are preferably centered between the centers of the charge distributions for the reading pulses. The centers of the charge read distributions are labeled $V_{r0}$ $V_{r1}$ and $V_{r2}$ corresponding to Read Level 2, Read Level 1 and Read Level 0, respectively. Read level $V_{r0}$ typically has a value of approximately 0V, Read Level $V_{r1}$ a value of approximately 800 mV and Read Level $V_{r2}$ a value of approximately 1.6V. It is desired that there be no intersection between the programming and read distributions so that the read process can accurately predict the levels of the memory cell are properly programmed.

Table 2 below shows a preferred correspondence between the data storage levels E and 0–2, and the accessed logical bit values Q1, Q0, where Q1 and Q0 each represent a logical bit.

TABLE 2

| Level | $V_t$ | Q2 | Q0 |
|---|---|---|---|
| E | <–2.0 V | 1 | 1 |
| 0 | 0.4–0.7 V | 1 | 0 |
| 1 | 1.2–1.5 V | 0 | 1 |
| 2 | 2.1–2.4 V | 0 | 0 |

Since Level E is considered the default (erased) setting, there 2N–1 levels—in the case N=2, there are $2^2-1=3$ levels (i.e. Level 2, 1, and 0)—that must be programmed, depending on loaded data. In a known manner of programming, each of the $2^2-1$ levels is programmed so that the programmed independently of the other levels. Each level is independently programmed so that the programmed inhibited bit-lines can be set. This separate programming results in the total programming time being equal to $(2^N-1)*SBPT$. As the number of logical bits stored in the flash memory cell increases, the programming time becomes exponentially larger and more burdensome. For example, a 4-bit (N=4) MLC design can have a programming time that is 5 times greater than that of a 2-bit MLC design.

In order to achieve the above programming one or more pulses are applied to each $V_t$ level separately. In the case of N=2, initially pulses of a voltage, such as 20V in the above example, are applied to the memory cells to be programmed to level 0. After level 2 is programmed, one or more pulses of a voltage, such as 19V in the above example, are applied to the next level 1 until all memory cells to be programmed to level 1 are programmed. Next, one or more pulses of a lower voltage, such as 18V in the above example, are applied to the next level 0 memory cells until level 0 is programmed. Note that the voltages of the pulses are dependent on the desired speed of programming.

To erase a cell in the flash memory array 200, relatively high substrate-to-gate voltage pulses are applied. The substrate 104 is charged to 19V while the gate 107 is grounded. The high potential will evacuate the electrons from the floating gate 102 and thus lower the $V_t$ of the memory cell. The memory cell 202 with a lowered $V_t$ will represent a logical "1" when the memory cell 202 is accessed for reading.

To read the state of a memory cell 202, a typical read level voltage is applied to the memory cell 202. The current output from the cell being read is received at an input of a number of the sense amplifiers 216 connected to the same bitline 204 as the memory cell 204 being read. A second input to each sense amplifier 216 is provided from a current reference 218. The current reference 218 provides a reference current to each sense amplifier, with a current level set equal to the current expected from a cell being read when programmed to a desired threshold voltage state. Binary outputs of the sense amplifiers 216 indicate if the cell being read is in a state that is greater than or less than the state of the reference signal received. Outputs of the sense amplifiers are provided through data latch/buffers 220 to the processor 214, enabling the processor 214 to determine from the sense amplifier outputs the threshold state of the cell being read.

In a known manner for program-verifying as discussed above, MLC designs require verify cycles after each program pulse for each $V_t$ level in the MLC array. For storage of N logical in the MLC flash memory cell, N–1 verify cycles are necessary. Each verify cycle requires time for bit-line preparation and voltage level setup time. As the N number of the bits stored in the memory cell increases, the verify time increases proportionally. Accordingly, there is a need in the art for a circuit and method for reducing verify time in a MLC flash memory device and allow all N–1 levels to be verified concurrently.

BRIEF SUMMARY

One aspect of the present invention regards a semiconductor memory device comprising a plurality of flash memory cells operative for storing one or more logical bits of data and a staircase program-verify circuit for concurrently verifying programming of the one or more bits of data in each of the plurality of flash memory cells. Flash memory cells operative for storing multiple bits of logical data within a single memory cell are known in the art and commonly referred to as multilevel cell (MLC) flash memory. The plurality of MLC flash memory cells collectively is commonly referred to as a MLC flash memory array. MLC flash memory designs comprise at least one storage element that is programmable to any one of distinct multiple states. The multiple programmable states are commonly referred to as levels. Each programmable level represents a distinct combination of logical bits. Data is stored in a MLC flash memory design by programming the memory cell to a selected level representative of the combination of logical bits to be stored within the MLC flash memory cell. By way of example, a MLC flash memory cell designed for storing two logical bits of data can store the logical bit combination "01" by programming the MLC flash memory cell to a selected level representative of that logical bit combination.

The staircase program-verify circuit is operative to verify that the MLC flash memory cell has been programmed to the selected level representative of the logical bit combination to be stored by the MLC flash memory cell and inhibit further programming of the MLC flash memory cell. The staircase program-verify circuit is further operative to concurrently verify programming of each of the discrete multiple programmable levels in the plurality of MLC flash memory cells by applying a single stepped voltage pulse to the MLC flash memory cells to complete all program level evaluations. A distinct programmable level is verified prior to each step of the pulse. The initial value of the stepped voltage pulse is selected to be within a range substantially equivalent to that necessary to read data from the highest programmable level of the MLC flash memory cell and preferably within a range to provide a read margin to compensate for functional variations and reliability concerns. Each subsequent voltage level of the stepped voltage pulse is within a range substantially equivalent to a voltage necessary to read data from the next lowest programmable level preferably within a range to provide a read margin to compensate for functional variations and reliability concerns. The program-verify circuit evaluates the programming of each level, verifies that the MLC flash memory cell is programmed to a desired level and inhibits that verified MLC flash memory cell from further programming pulses. Accordingly, the staircase program-verify circuit concurrently verifies all programmed levels of the MLC flash memory array and thereby increases verify performance.

A second aspect of the present invention is a method of concurrently verifying programming of each of the multiple programmable levels in a MLC flash memory array. The method comprises verifying programming of the highest program level in the MLC flash memory array to inhibit further programming of MLC flash memory cells that are verified as programmed for the highest level, and verifying each next lowest significant program level to inhibit further programming of MLC flash memory cells that are verified as programmed for that level until each significant program level has been verified.

One example of the method for concurrently verifying the programming of MLC flash memory designs comprises the step of applying a single stepped voltage pulse to the MLC flash memory array. The stepped voltage pulse has an initial value within a range substantially equivalent to that necessary to read data from the highest programmable level of the MLC flash memory cell and preferably within a range to provide a read margin to compensate for functional variations and reliability concerns. Each subsequent voltage level of the stepped voltage pulse is within a range substantially equivalent to a voltage necessary to read data from the next lowest programmable level preferably within a range to provide a read margin to compensate for functional variations and reliability concerns. At each step of the voltage pulse, a distinct programming level is evaluated and the MLC flash memory cells programmed to that level are inhibited from further programming pulses. The evaluation process continues by stepping down the voltage pulse to the next lowest level and inhibiting further programming of MLC flash memory cells programmed to that level until each significant program level is verified. Accordingly, this method allows for preclusion of programming of memory cells that have been verified as programmed and increases the performance for program-verifying of a MLC flash memory design.

The foregoing discussion of the summary of the invention has been provided only by way of introduction. Nothing in this section should be taken as a limitation on the claims, which define the scope of the invention. Additional objects and advantages of the present invention will be set forth in the description that follows, and in part will be obvious from the description, or may be learned by practice of the present invention. The objects and advantages of the present invention may be realized and obtained by means of the instrumentalities and combinations particularly pointed out in the claims.

DESCRIPTION OF THE PRESENTLY PREFERRED EMBODIMENTS

Hereinafter embodiments of the present invention will be explained with reference to the accompanying figures.

The illustrated embodiments provide system for program-verifying a multi-level-cell semiconductor memory device, commonly called a MLC flash memory device. An MLC flash memory device typically comprises an array of memory cells each having at least one storage element therein, the storage element configured to be programmed to store an N-bit combination of logical data, where $N \geq 2$. The storage element, typically a transistor with a programmable threshold voltage $V_t$, is configured to store the N-bit combination of logical data by programming the storage element to any one of $2^N$ data storage levels. To ensure accurate programming of data in the memory array and to inhibit a properly programmed memory cell from subsequent programming, the data stored therein is program-verified. The principles of the present invention provide a system for reducing the time to program-verify a MLC flash memory device, and thereby overall program time, according to concurrently verifying a plurality memory cells independent of the N-bit combination of data stored therein. It will be recognized that one advantage of the present invention is increasing programming performance and reliability while also reducing the time to program for the MLC flash memory cells by concurrently verifying all of the program levels of a plurality memory cells.

Figure 1:
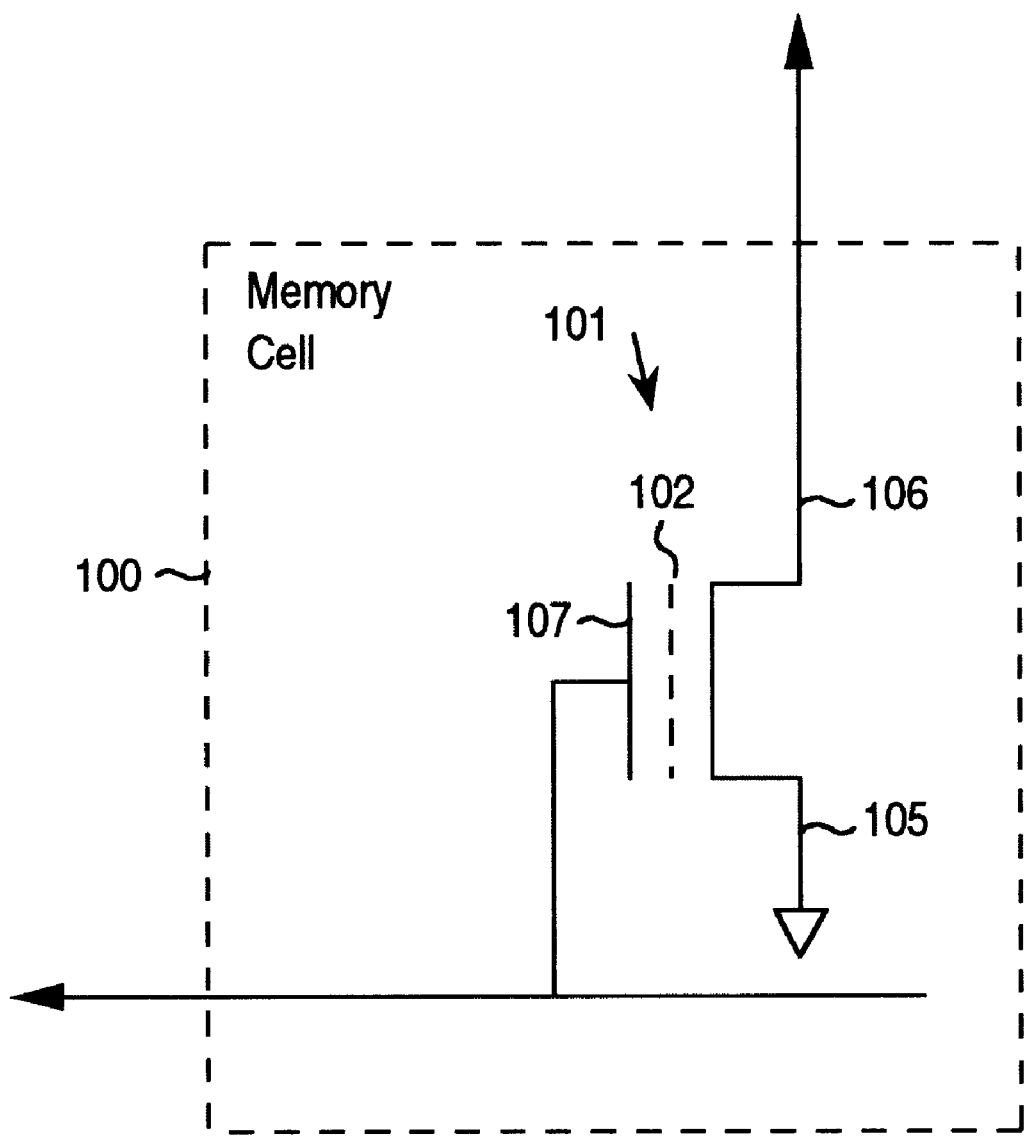
FIG. 1 is a schematic diagram that illustrates a memory cell.
Figure 1A:
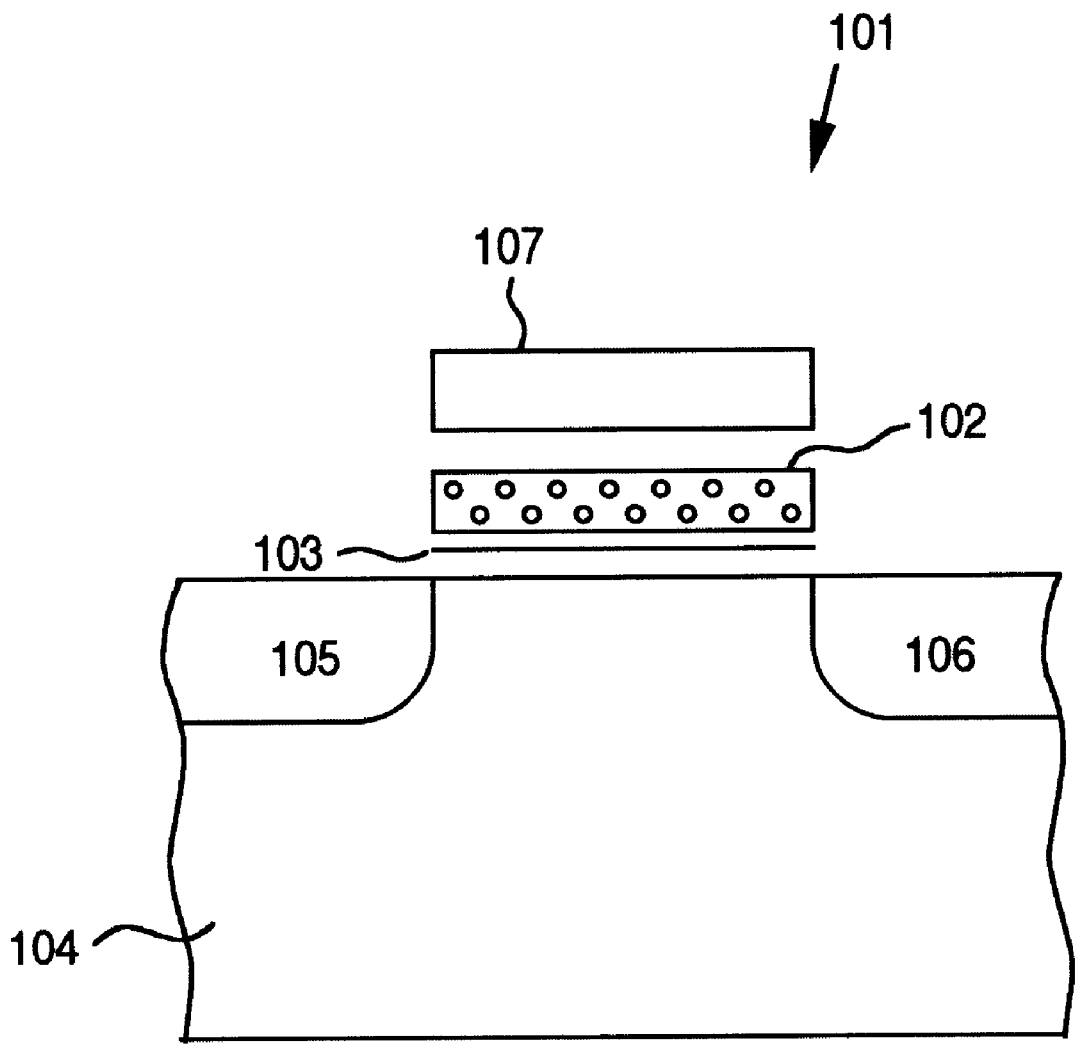
FIG. 1a is a cross-section view of a memory transistor with a floating gate.
Figure 2:
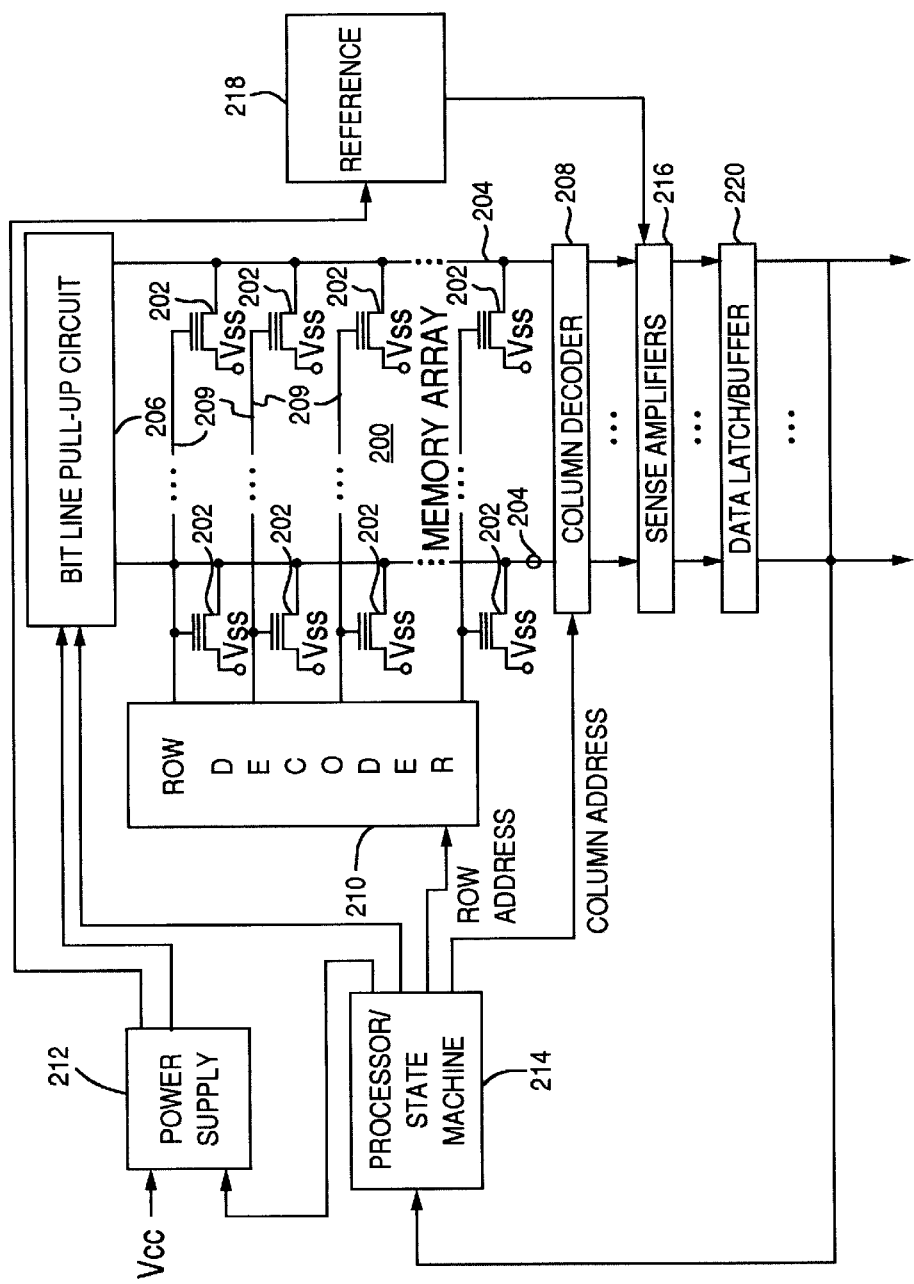
FIG. 2 is a schematic illustration of one embodiment of an integrated circuit with a flash memory array.
Figure 3:
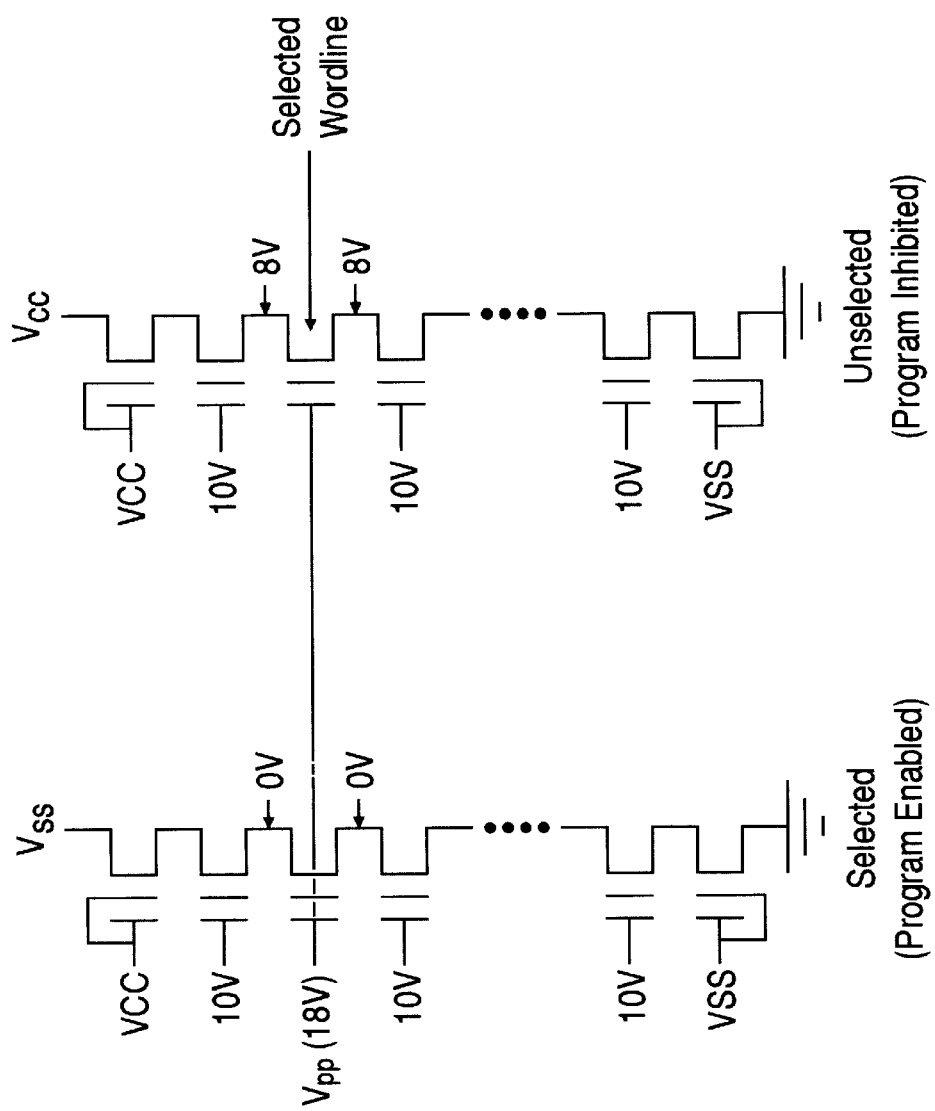
FIG. 3 shows programming and verifying a flash memory cell.
Figure 4A:
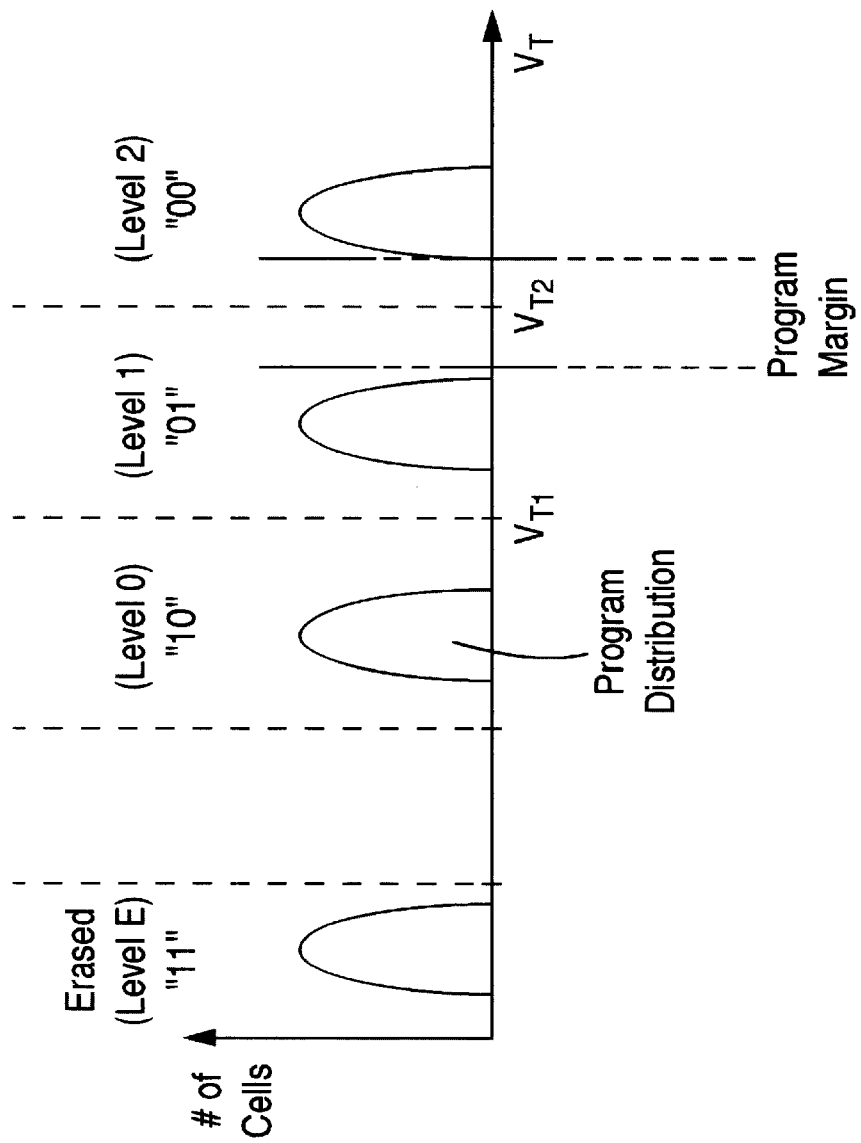
FIG. 4a shows a distribution of program levels for $V_t$ for the flash memory array of 2-bit multi-level-cells.
Figure 4B:
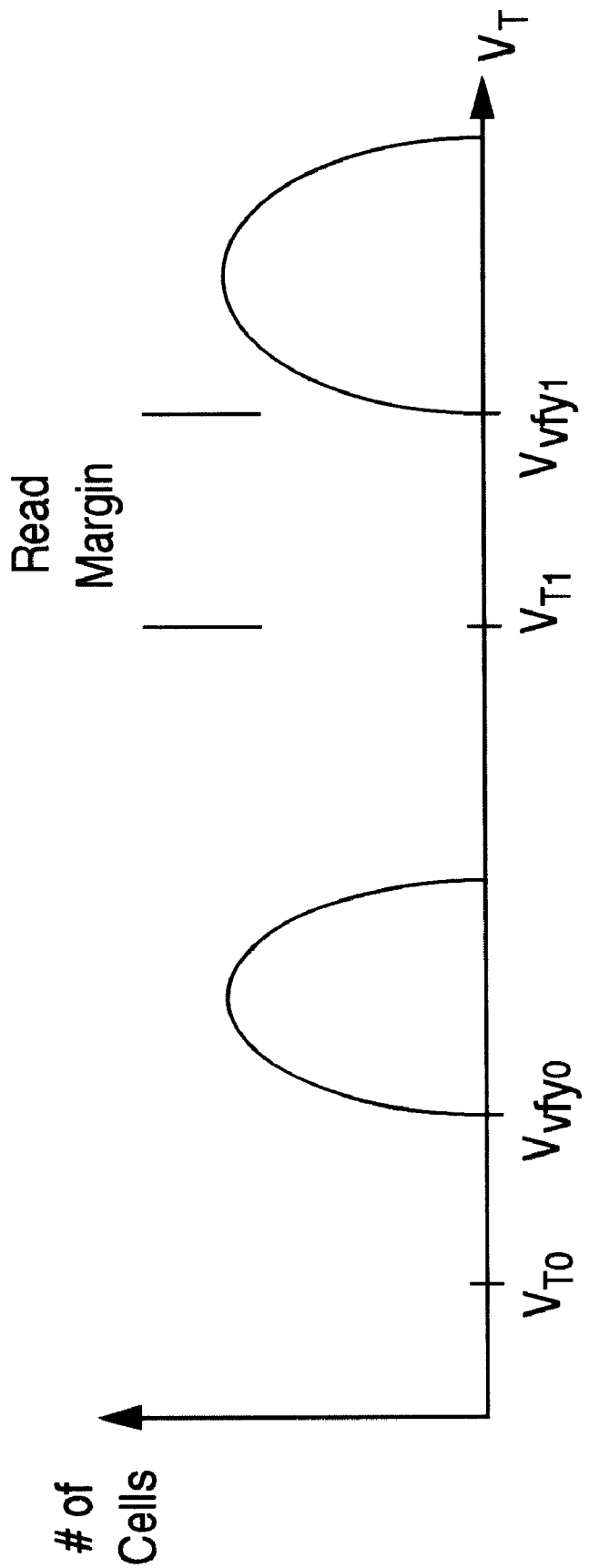
FIG. 4b shows a distribution of program levels for $V_t$ for the flash memory array of 2-bit multi-level-cells.
Figure 5:
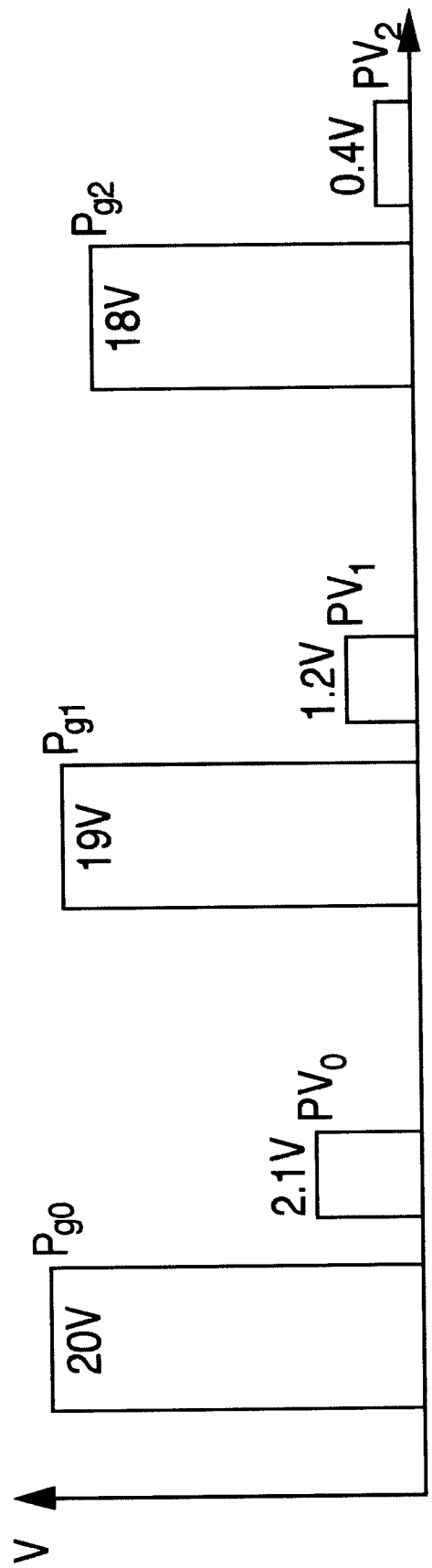
FIG. 5 schematically shows a known programming and verifying process where each level of the multi-level-cell used in a flash memory array is independently programmed and verified.
Figure 6:
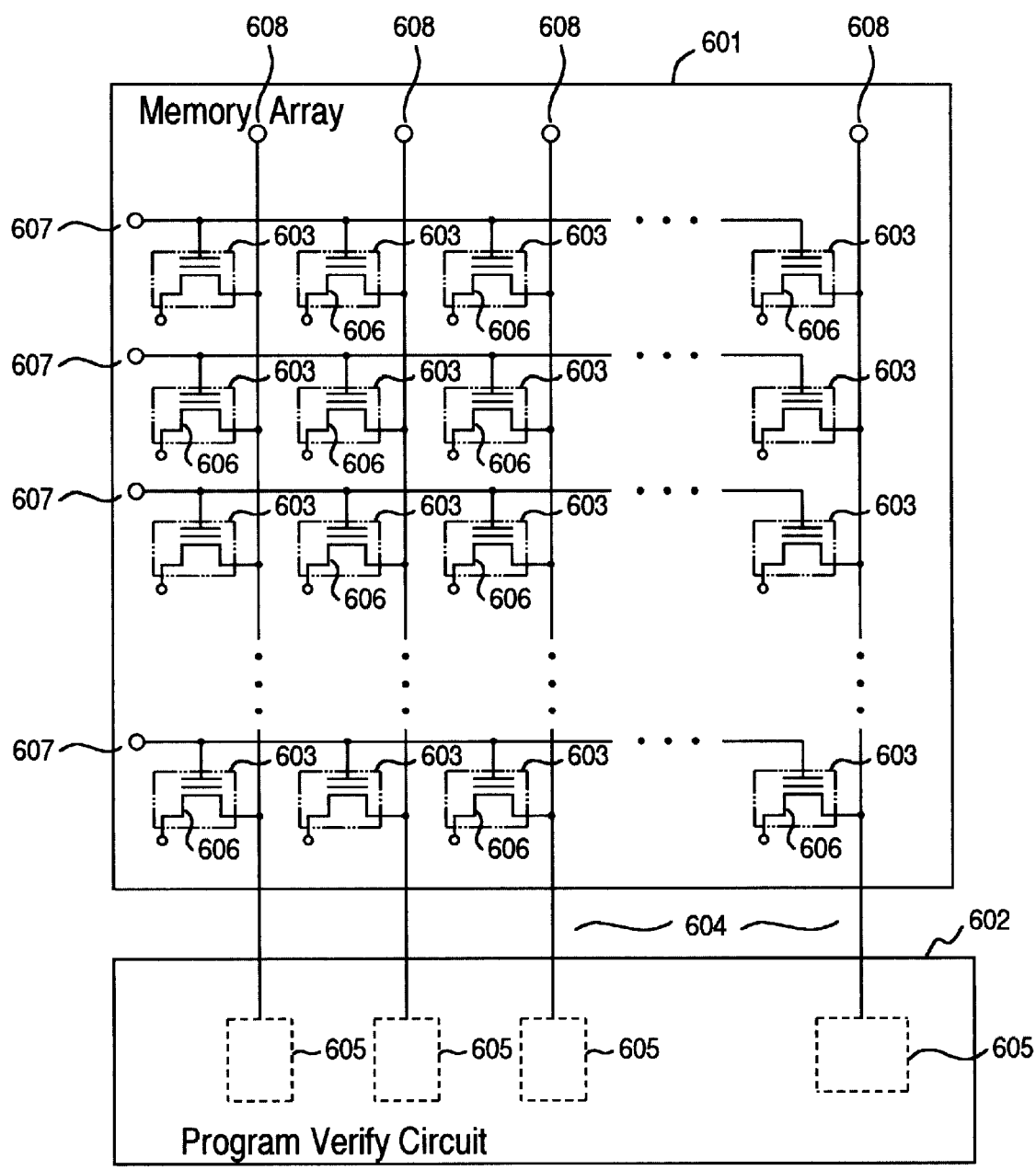
FIG. 6 schematically illustrates a MLC flash memory device of the present invention.

FIG. 6 illustrates a MLC flash memory device according to the principles of the present invention. The MLC flash memory device 600 comprises a memory array 601 and a program-verify circuit 602. The memory array comprising a plurality of memory cells 603, each configured to store N bits of logical data in any of $2^N$ data storage levels. The memory array is arranged into rows 607 and 608. The program-verify circuit 602 is electrically coupled to the memory array 601 through bit-lines 604 to effectuate program-verifying of the data stored in the memory array 601. The program-verify circuit 602 comprises a module 605 electrically coupled to each column 608. In a preferred embodiment, each memory cell 603 comprises a transistor 606 having a $V_t$ programmable within a continuous range from a lowest $V_t$ value to a highest $V_t$ value towards the most positive programmable $V_t$ for the transistor 606. The continuous range in which the transistor 606 can be programmed has $2^N$ distinct data storage levels, including an erased level, which is a default data storage level, and $2^N-1$ program levels. The $2^N-1$ program levels include a lowest program level, at least one intermediate program level, and a highest program level. The N-bit combination of logical data is electrically stored in the memory cell 603 by programming the $V_t$ for the transistor 606 to the data storage level corresponding to a discrete N-bit combination of data. The program-verify circuit 602 is operative to concurrently verify the $2^N-1$ program levels for each of the plurality of memory cells 603. Because the default level is the erased level, data stored at the erased level does not need to be program verified.

Figure 7A:
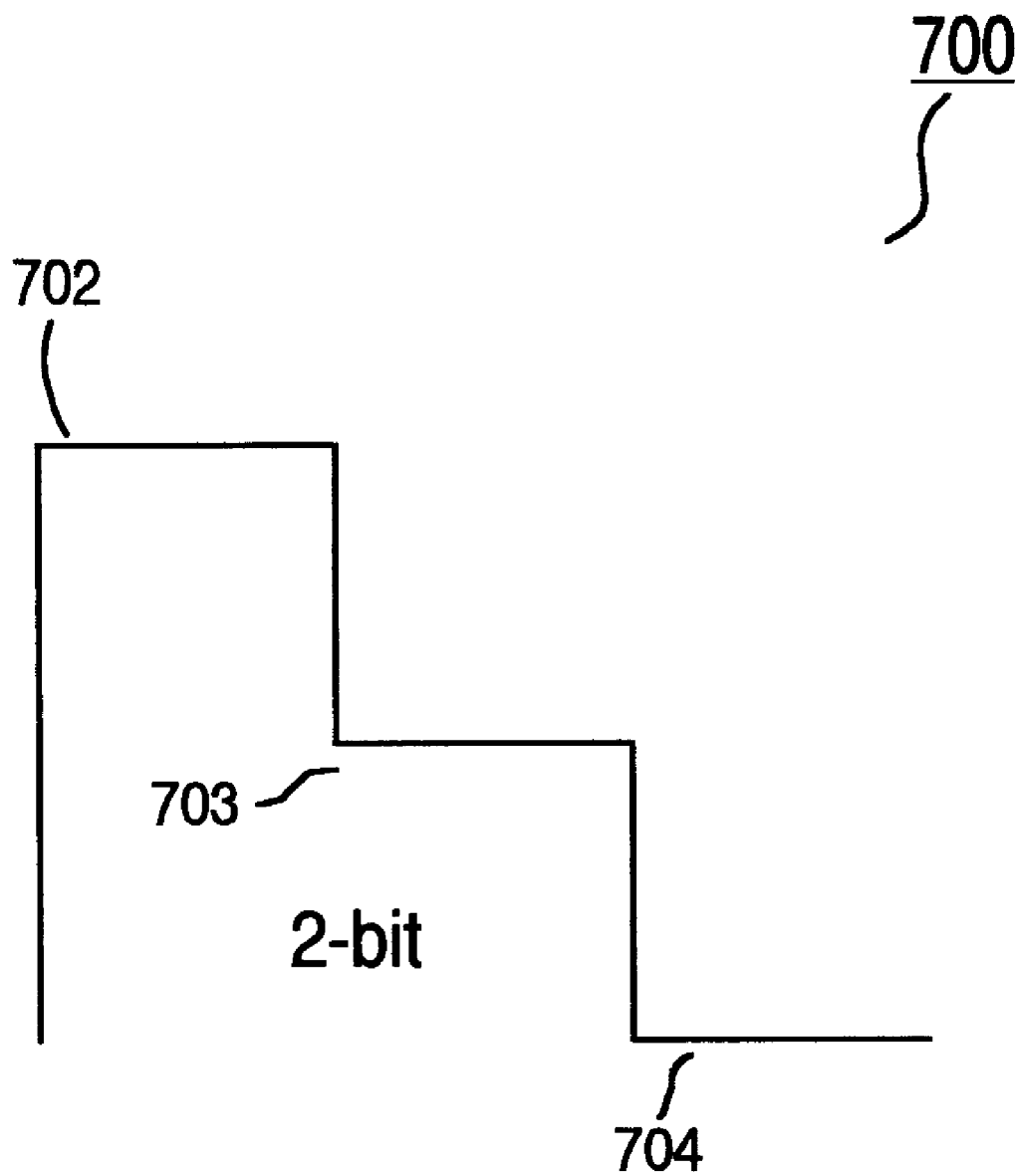
FIG. 7 illustrates staircase program-verify pulses of the present invention.
Figure 7B:
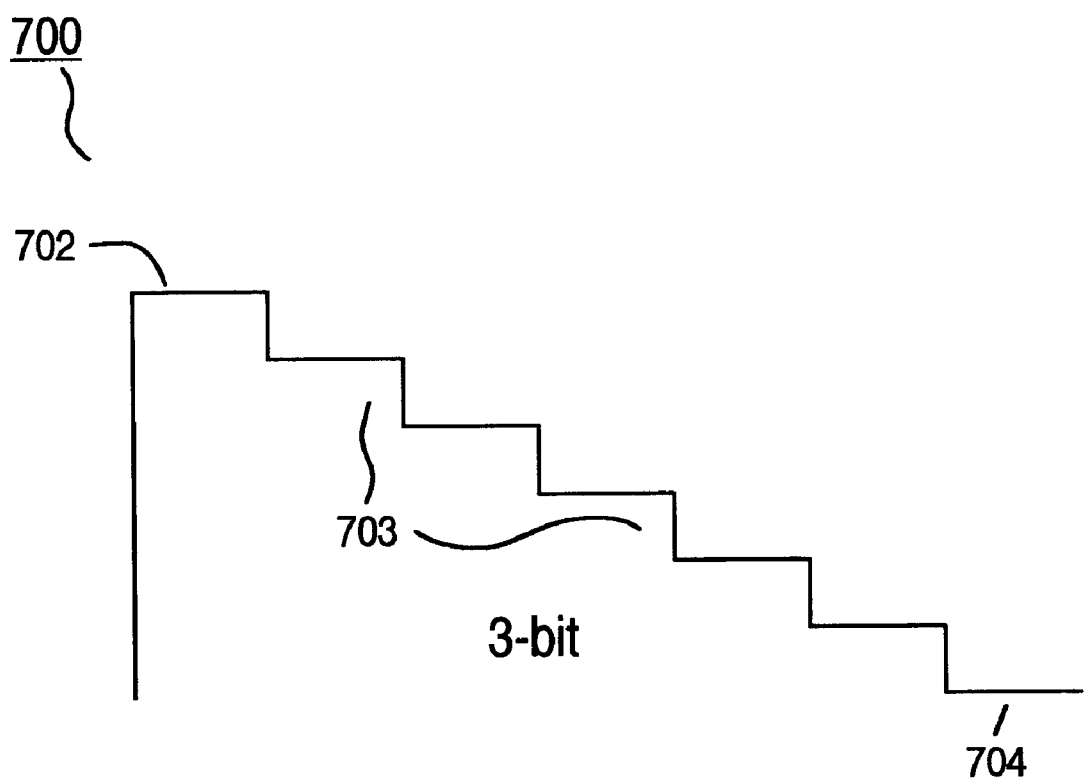

FIGS. 7a and 7b illustrate stepped voltage pulses 700 applied by the program-verify circuit 602 to each of the plurality of memory cells 603, described for FIG. 6 above. The configuration of the voltage pulse illustrated is also commonly referred to as a staircase voltage pulse. FIG. 7a illustrates a stepped voltage pulse for a memory cell configured to store a 2-bit combination of logical data and FIG. 7b illustrates a staircase voltage pulse for a memory cell configured to store a 3-bit combination of logical data. The stepped voltage pulse comprises an initial step 702, at least one intermediate step 703, and a final step 704. The stepped voltage pulse has a total of $2^N-1$ of steps, where N is the number of bits stored by the memory cell 603. For example, the 2-bit stepped voltage pulse 700 of FIG. 7a has $2^2-1=3$ steps 703, while the 3-bit stepped voltage pulse 700 of FIG. 7b has $2^3-1=7$ steps 703. Those skilled in the art will recognize that the stepped voltage pulse can be scaled for any N-bit combination that can be programmed into a MLC flash memory cell.

The value for the initial step 702 is substantially within the $V_t$ range for the highest program level for the plurality of memory cells 603, the intermediate steps 703 have values substantially within the $V_t$ range for respective intermediate program values of the plurality memory cells, and the value for the final step 704 is substantially within a range for the lowest program level for the plurality of memory cells 603. A new program level is verified for each step of the stepped voltage pulse. The program-verify circuit 602 is operative for inhibiting a memory cell 603 from further applications of program pulses when it is verified as programmed to a desired level for the data to be stored by the memory cell 603. A memory cell 603 not verified as programmed to the desired level remains uninhibited until it is programmed to the desired level for the data to be stored by the memory cell 603. The program-verify circuit 602 stops programming specific memory cells 603 when the desired $V_t$ level has been achieved.

Figure 8:
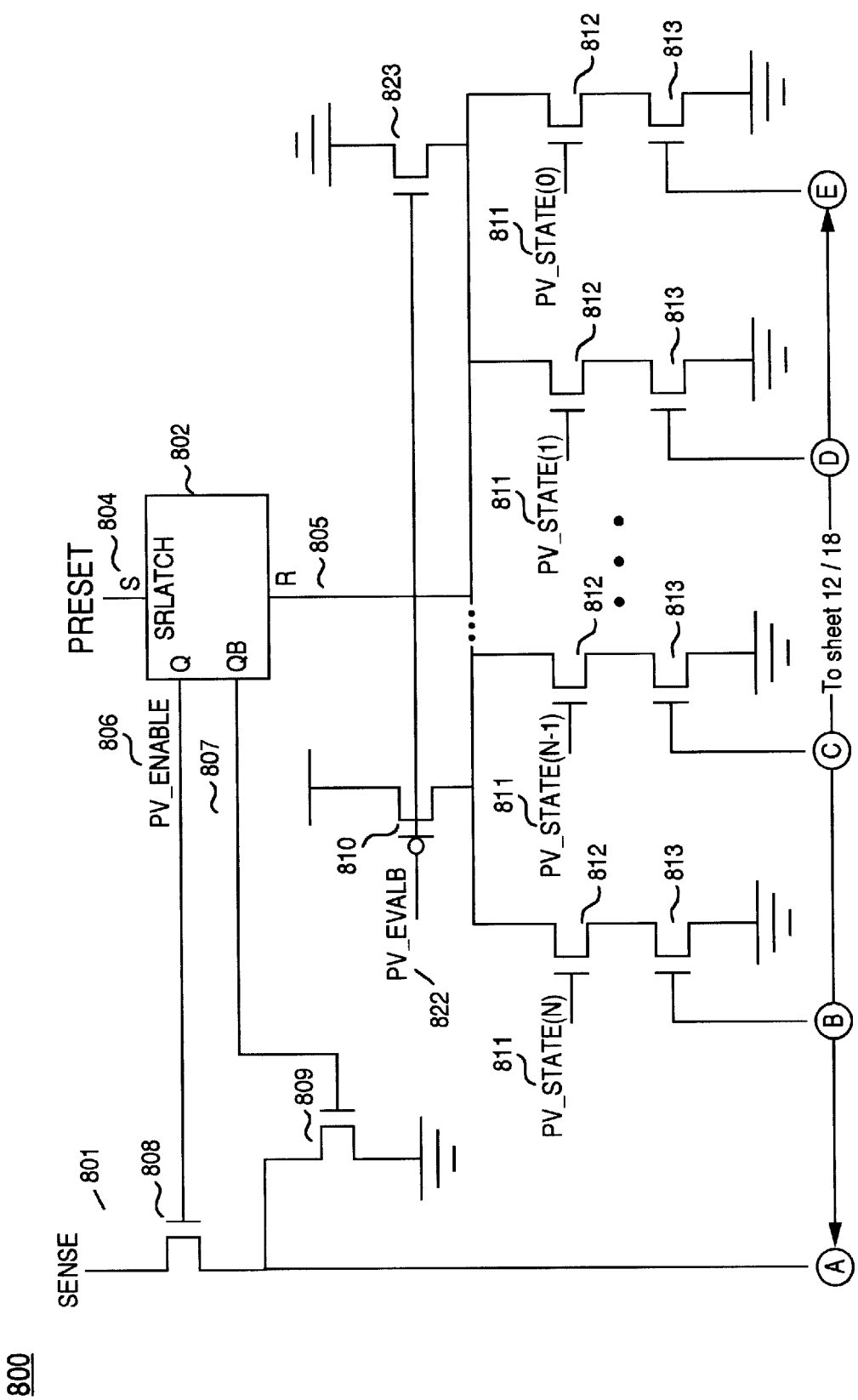
FIG. 8 is an embodiment of a program verify circuit of the present invention.
Figure 8:
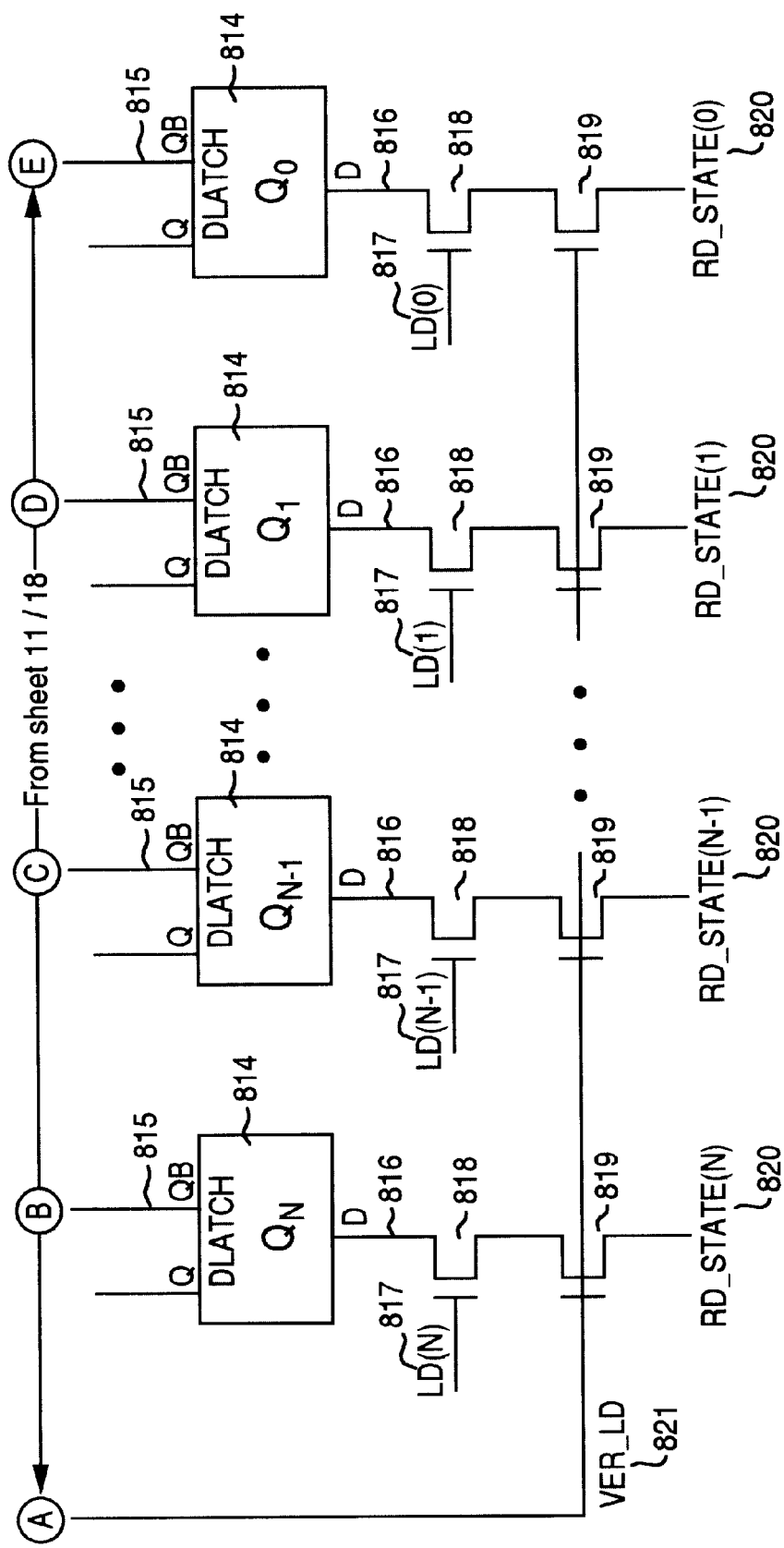

The program-verify circuit 800 of FIG. 8 represents a detailed schematic representation of the module 605 as described in FIG. 6. The program-verify circuit 800 is electrically coupled to a memory cell 603, through a sense line 801. The program-verify circuit 800 comprises a preset flip-flop 802, a plurality of data-verify flip-flops 814, a program-verify evaluate ("PV_EVALB") transistor 810, a pull-down transistor 823, a program-verify enable ("PV_ENABLE") pass transistor 808, a program-verify disable pull-down transistor 809, a plurality of program-verify state ("PV_STATE(N)") transistors 812, a plurality of program-verify data latching transistors 813, a plurality of load data ("LD(N)") transistors 818, a plurality of read data state ("RD_STATE(N)") transistors 819, each transistor having a source, a drain, and a gate. In a preferred embodiment, the preset flip-flop 802 is a set/reset type latch commonly called a S/R latch, having an s-input 804, an r-input 805, a Q output 806, and a QB output 807 that has the negative logical value of the Q output 806. The Q output 806 of the preset latch 804 is electrically couple to the gate of the program-verify enable pass transistor 808, while the QB output is connected to the gate of the program-verify disable pull-down transistor 809. The drain of the program-verify enable pass transistor 808 provides the sense line 801 while the source of the program-verify enable pass transistor 808 is electrically coupled to the drain of the program-verify disable pull-down transistor 809, which has its source electrically grounded (0V). The s-input 804 provides an input to the program-verify circuit 800 to preset the s/r latch 802 prior to application of the stepped voltage pulse 701 to the memory cells 603, as described in further detail below.

In a preferred embodiment, the data-verify flip-flops 814 are latches commonly called a D-latch. The D-latch has an input 816 and a QB output 815. The number of D-latches is at least equal to the number of bits (N) to be stored by the memory cell 603. Each input 816 of the D-latch 814 is electrically coupled to the drain of a load data transistor 818, while each QB output 815 is electrically coupled to the gate of a program-verify data-latching transistor 813. The gate of the load data transistor 818 provides a load data input 817 for loading a bit of data into the D-latch 814 while its source is electrically connected to the drain of a read data state transistor 819, the source of which provides a read data state 820. The gate of each read data state transistor 819 is electrically connected to drain to the source of the program-verify enable pass transistor 808, which is also electrically coupled to the drain of the program-verify disable pull-down transistor 809, as previously described and provides a verify load ("VER_LD") signal.

Each program-verify data-latching transistor 813 is connected between ground and a program-verify state transistor 812. The source for the program-verify state transistor 812 is electrically coupled to the drain of the program-verify data-latching transistor 813 and its gate provides a program verify state input 811. Each drain for program-verify state transistor 812 is electrically coupled to the r-input 805. The program-verify evaluate transistor 810 and the pull-down transistor 823 are also electrically connected between the r-input 805 and ground (0V). The gates of the program-verify evaluate transistor 810 and the pull-down transistor 823 provide an input for a program verify timing signal PV_EVALB 822.

The load data input LD(N) 817 provides each bit of the N-bit logical data to be program-verified. Each load data input LD(N) 817 and D-latch $Q_N$ 814 corresponds to an Nth significant logical bit to be stored by the memory cell 603. A logical input signal is provided on each load data input LD(N) 817 to set the corresponding QB output 815 of the corresponding D-latch $Q_N$ 814 to the logical input of LD(N). By way of example, a memory cell configured to store the logical bit combination "00" is to be programmed to a level 2 and an input signal is provided to LD(1) and LD(0) to set the output $QB_1$ and $QB_0$ both to the logical value "0." During program-verify operation, each read data state each LD(N) 817 is on (logical value "1") and "RD_STATE(N)" 820 is electrically coupled to ground "0."

Figure 9:
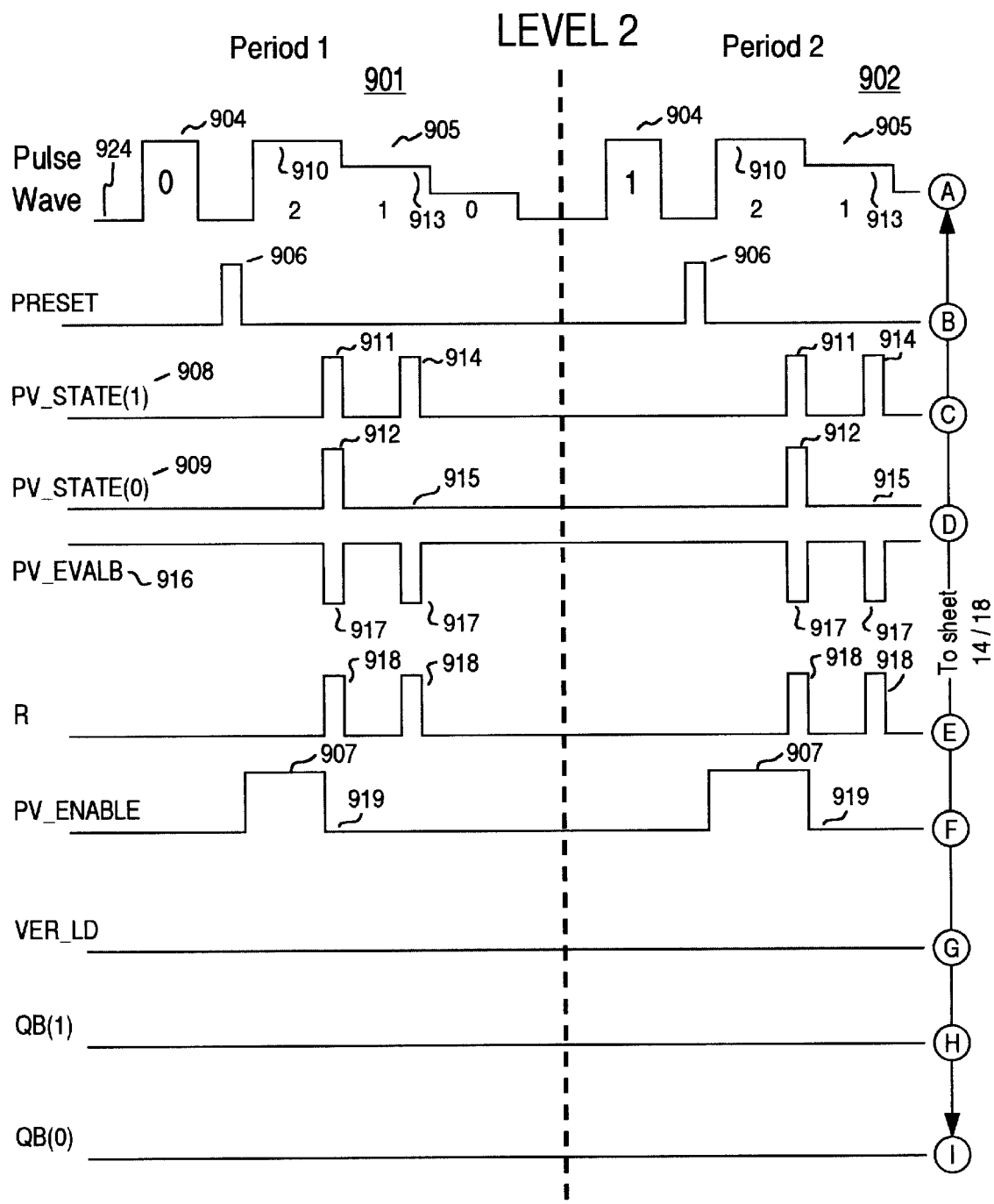
FIG. 9 is a timing diagram for a program-verify operation of memory cell programmed according to a preferred embodiment of the present invention.
Figure 9:
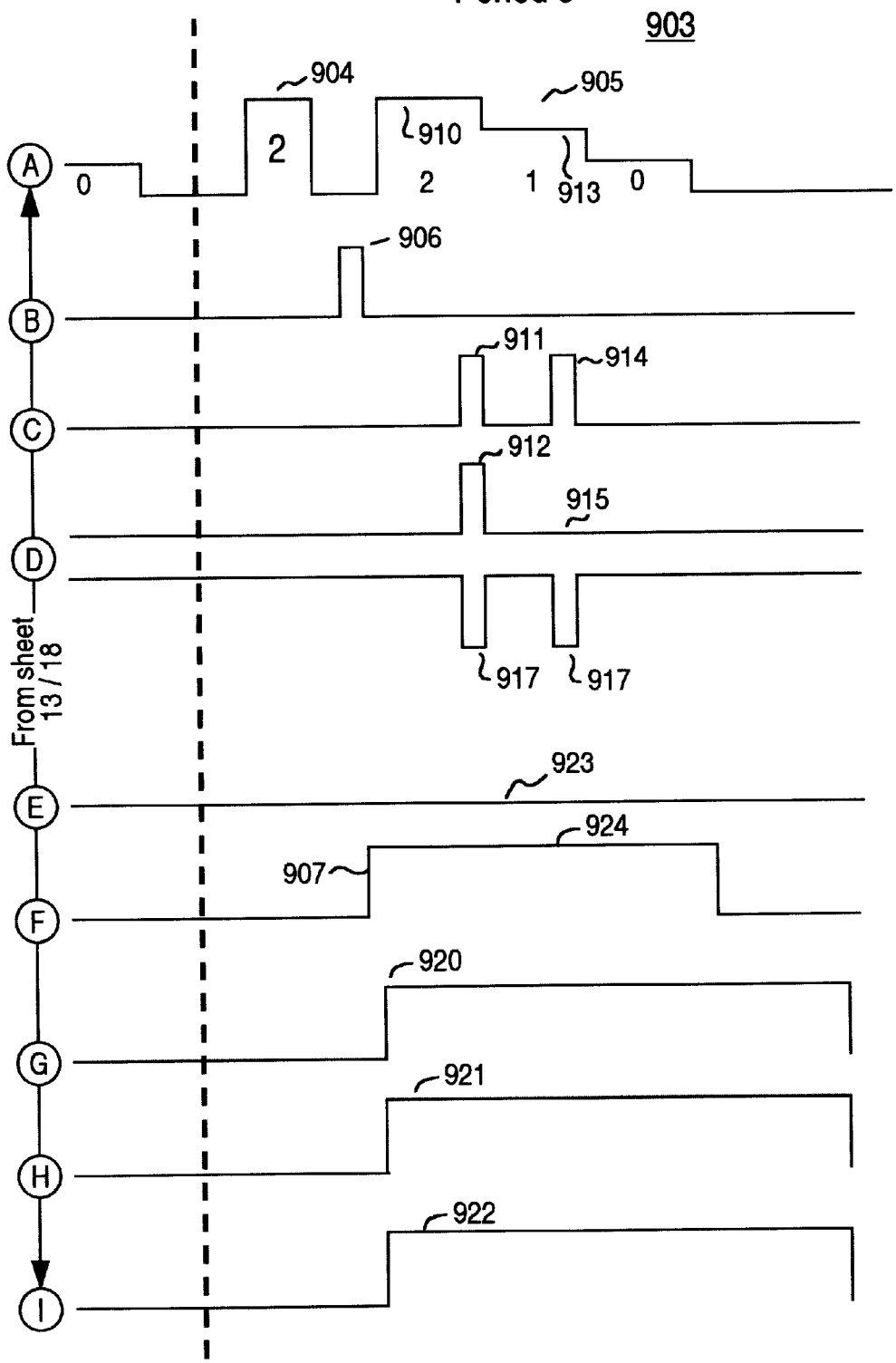
Figure 10:
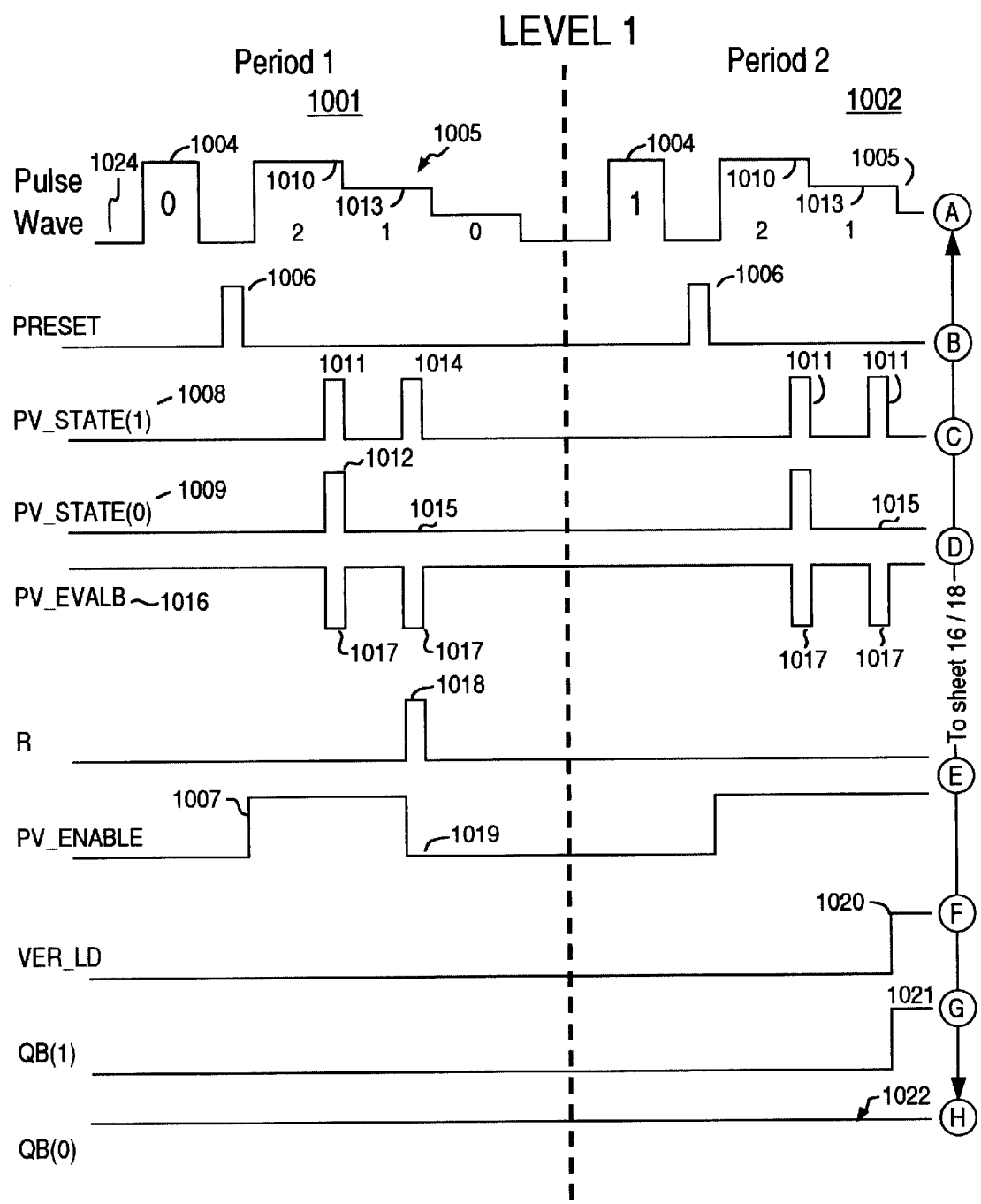
FIG. 10 is a timing diagram for a program-verify operation of memory cell programmed according to a preferred embodiment of the present invention.
Figure 10:
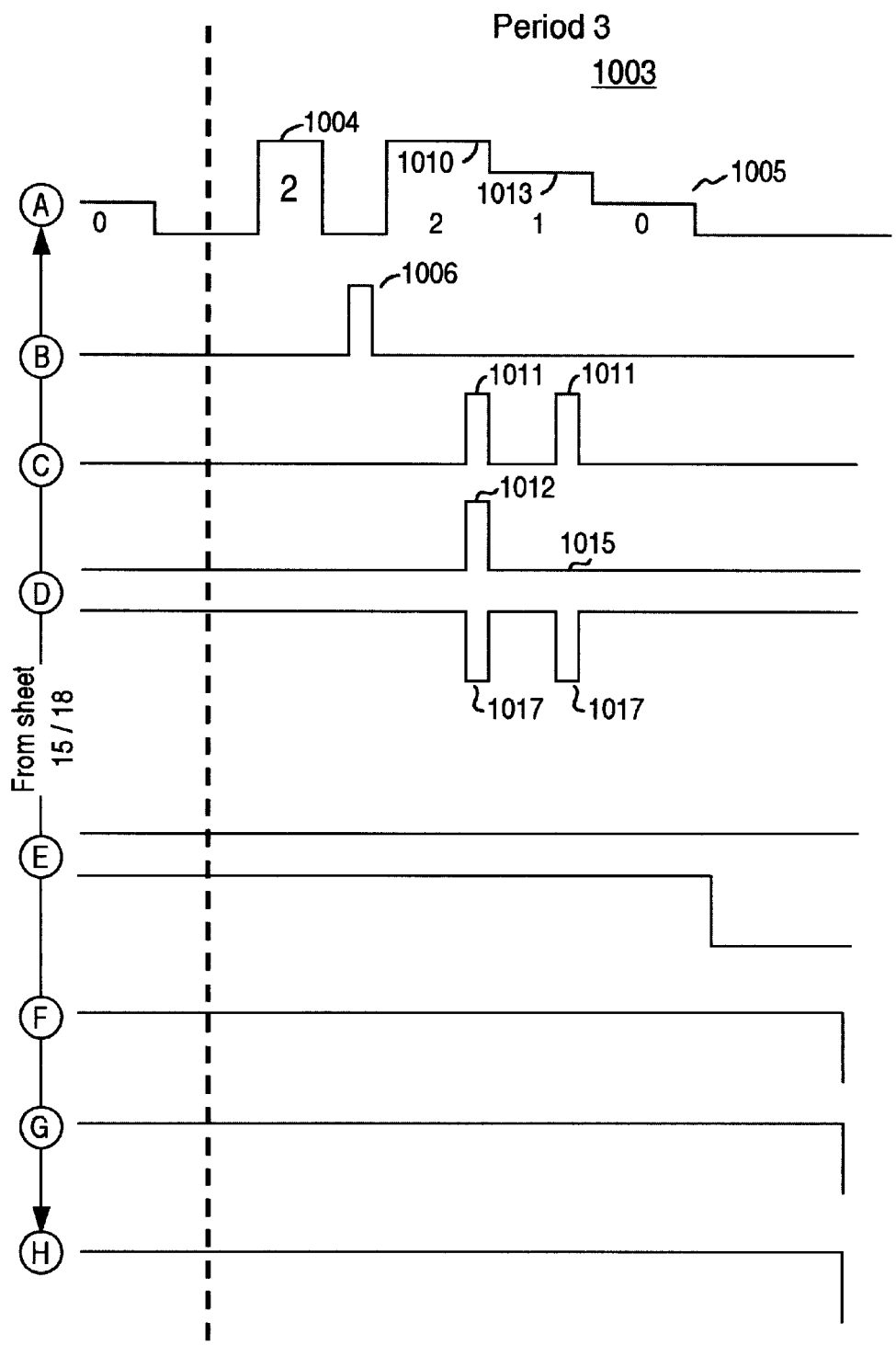
Figure 11:
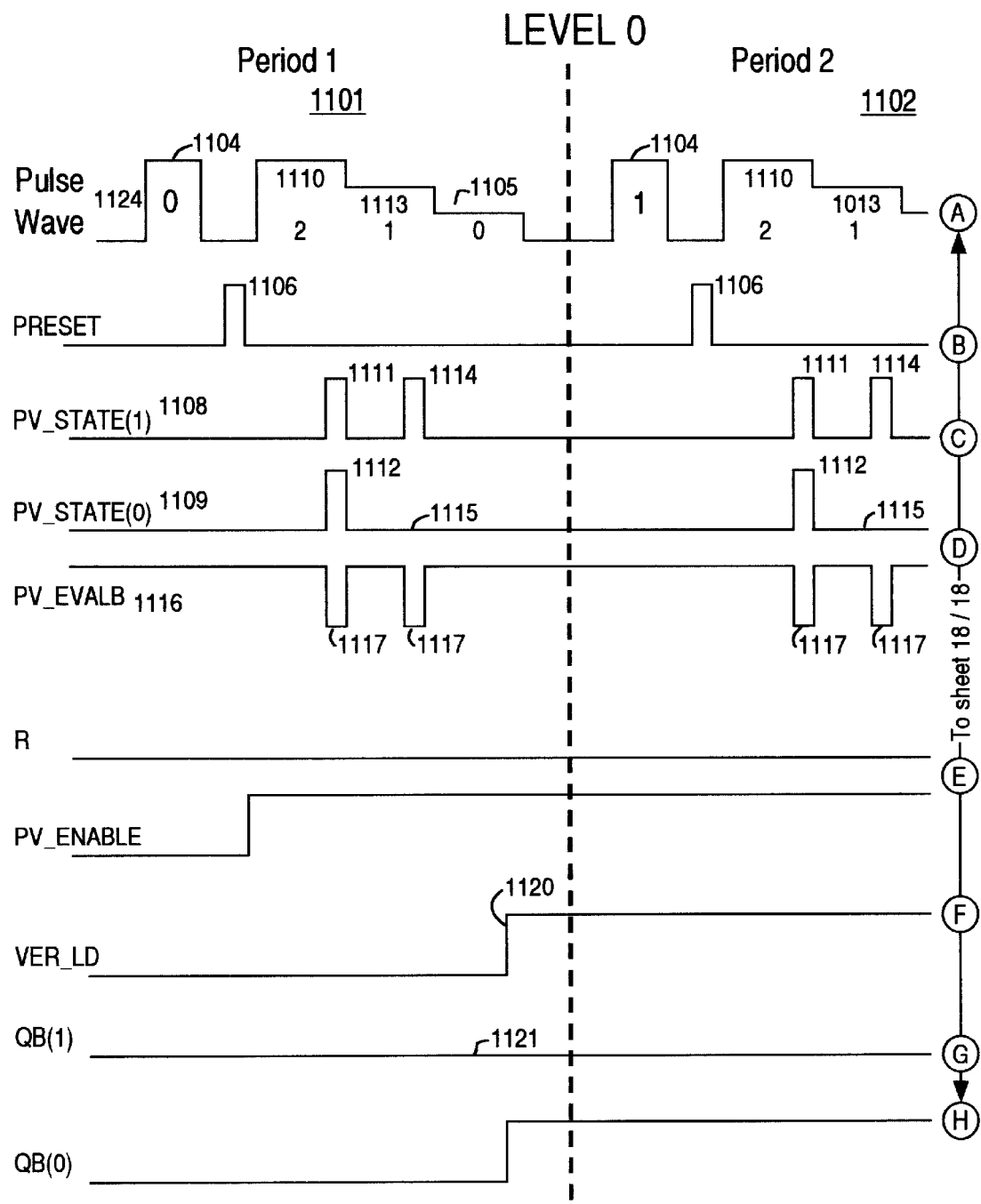
FIG. 11 is a timing diagram for a program-verify operation of memory cell programmed according to a preferred embodiment of the present invention.
Figure 11:
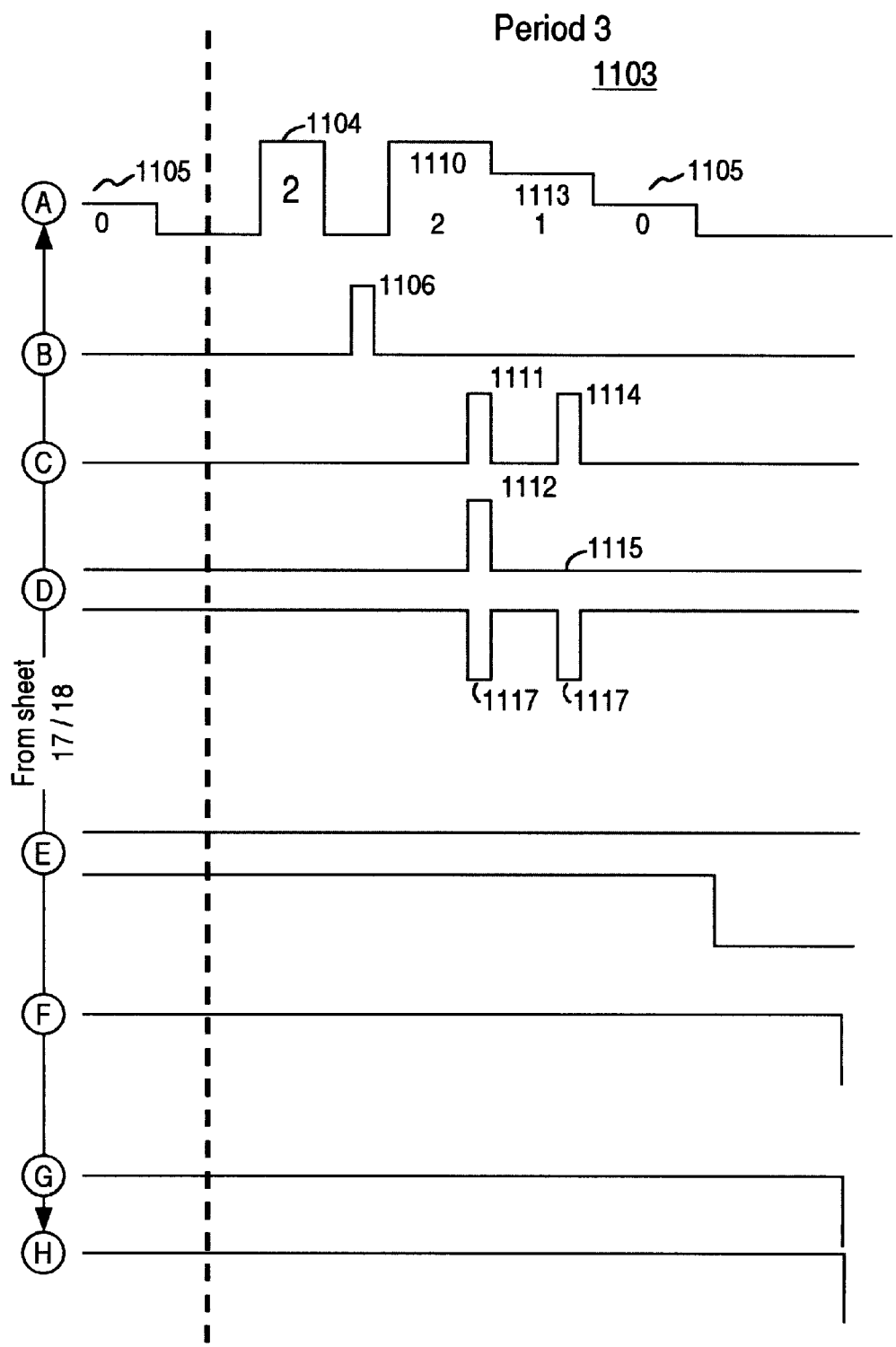

Referring now to FIGS. 9–11, an example of an operation of the embodiment of the program-verify circuit 800 according to FIG. 8 is described. FIGS. 9–11 illustrate timing diagrams for input signals and output signals for the program-verify circuit 800 of FIG. 8. Specifically, FIG. 9 illustrates a timing diagram for an example of the operation of program-verify circuit configured for a 2-bit MLC flash memory wherein the memory cell is as program-verified for level 2, FIG. 10 illustrates the same circuit wherein the memory cell is program-verified for level 1, and FIG. 11 illustrates the circuit wherein the memory cell is as program-verified for level 0. Although it is commonly known that of the number and value of program pulses required to program a memory cell to a desired level varies, by way of example only, the FIGS. 9–11 illustrate timing diagrams for a memory cell 603 capable of being programmed to level 0 with one program pulse, to level 1 with 2 program pulses and to level 3 with three program pulses. A level 2 programming represents the logical bit combination "00;" level 1 represents the combination "01;" level 0 represents the combination "10;" and the erased level represents "11."

FIG. 9 illustrates a first timing period 901, a second timing period 902, and a third timing period 903. For each timing period, a pulse wave 924 is applied to the memory cell 603. The pulse wave 924 comprises a program pulse 904 and a staircase program-verify pulse 905. The staircase program-verify pulse wave 905 is configured for this example as described above for a 2-bit MLC flash memory design. Assuming the memory cell 603 of this example is capable of being programmed to level 2 with 3 program pulses 904, the memory cell 603 is programmed after the application of the third program pulse 904, which occurs during the third period 903. Prior to the application of the staircase program-verify pulse 905, a PRESET input signal 906 is applied to the s-input 804 of the s/r latch 802, setting the output signal PV_ENABLE 907 on. With PV_ENABLE 907 turned on, the memory cell 603 is set for program-verify. The input signals PV_STATE(1) 908 and PV_STATE(0) 909 together provide the negative logical value of the level of the staircase program-verify pulse 905 being applied. For example, during level 2 (i.e. level 2=00) of the staircase program-verify pulse 910, PV_STATE(1) has logical value "1" 911 and PV_STATE(0) also has logical value "1" 912, while for level 1 (i.e. level 1=01) of the staircase program-verify pulse 913, PV_STATE(1) has logical value "1" 914 and PV_STATE(0) has logical value "0" 915. Thereby, PV_STATE(N) provides the state of the staircase program-verify pulse 905 to the program verify circuit 800 for each level of the staircase pulse with the exception of level 0, after which no further program verify evaluations are performed. PV_STATE(N) Input signal PV_EVALB 916 provides a logical signal with a logic value of "0" 917 during the staircase program-verify pulse 905 and substantially concurrently with input signals PV_STATE(1) 908 and PV_STATE(0) 909. The input signal PV_EVALB 916 enables the program-verify evaluate transistor 810, forcing a logic value "1" 918 to the r-input 805, and thereby resetting the s/r latch 802. Resetting the s/r latch has the effect turning off the PV_ENABLE signal 919, and thereby removing the level 2 memory cell from further program-verify evaluations during the staircase program-verify pulse 905 of the current period. Accordingly, the level 2 memory cell does appear verified during subsequent levels of the staircase pulse. The above operation is repeated, until the memory cell is programmed, as in the third period 903.

In the third period 903, the memory cell receives a program pulse 904, which has sufficiently programmed the memory cell 603 within for level 2. As in the first period, the PRESET signal 906 is applied to the s/r latch 802 after the program pulse 904 and enabling PV_ENABLE 907. Assuming that the third program pulse 904 was sufficient to program the memory cell to level 2, the sense line 801 will have a logic value "1" and will force a logic value "1" to VER_LD 920. With VER_LD 920 having a logic value "1" RD_STATE(N) will clear the $QB_1$ and $QB_0$ state of the D-latches 814, setting QB(1) to a logic value "1" 921 and QB(0) to a logic value "1" 922. With QB(1)=1 921 and QB(0)=1 922, the r-input will remain off 923 when PV_EVALB is switched low 917. Accordingly, because the s/r latch 804 does not reset PV_ENABLE and VER_LD remain on, inhibiting further programming of the memory cell 603 during any subsequent program pulses 904.

In FIG. 10, the timing diagram illustrates the operation for the program-verify circuit of FIG. 8 for the memory cell 603 program-verified for level 1. The figure shows a first period 1001, a second period 1002, and a third period 1003. In each period, a pulse wave 1024, comprises a program pulse 1004 and a staircase program-verify pulse 1005. Assuming the memory cell 603 is being programmed to level 1 with 2 program pulses 1004, the memory cell 603 is programmed to level 1 after the application of the second program pulse 904 occurring during the second period 1002. In this example, the D-latches 814 are loaded with the values QB(1)=0 and QB(0)=1, to represent the data stored for level 1. Similar to FIG. 9, a PRESET signal 1006 is applied to the s/r latch 802 after the program pulse 1004 and prior to the staircase program-verify pulse 1005 to enable the program-verify circuit 800 by setting PV_ENABLE to a logic value "1" 1007 and will remain until the r-input 805 is set with a logic value "1" 1018. In this example, because of the state of the D-latches 814, QB(1)=0 and QB(0)=1, PV_EVALB 1016 cannot force a logic value "1" 1018 on the r-input 805 until PV_STATE(1)=1 and PV_STATE(0)=0. Accordingly, PV_ENABLE 1007 remains on until the staircase program-verify pulse 1005 has reached the level 1 step 1013, after which it returns low ("0") 1019 precluding further evaluations of level 1 memory cells.

In the second period, the memory cell 603 receives a second program pulse 1004 and is programmed for level 1. Similar to FIG. 9, the sense line 801 will have a logic value "1" when the memory cell is programmed. Accordingly when the staircase program-verify pulse 1005 has a value substantially within level 2 1013 and PV_STATE(1)=1 1014 and PV_STATE(0)=0 1015, the D-latches 814 can clear, setting VER_LD high 1020. In this example, because QB(0) is preset with the logic value "1," 1022, VER_LD 1020 switches high when QB(1) is set high 1021. With the data in the d-latches cleared ("1"), the r-input 805 remains off when PV_EVALB 1016 is switched. Accordingly, the s/r latch 802 does not reset; PV_ENABLE remains high, and VER_LD 1020 remains high, inhibiting further programming of the memory cell 603.

The timing diagram of FIG. 11 similarly illustrates the operation for the program-verify circuit of FIG. 8 for the memory cell 603 program-verified for level 0. The figure shows a first period 1101, a second period 1102, and a third period 1103, and a pulse wave 1124, comprising a program pulse 1104 and a staircase program-verify pulse 1105. Assuming the memory cell 603 is programmed to level 0 with 1 program pulse 1104, the memory cell 603 is programmed to level 0 in the first period. To verify a level 0, the D-latches 814 are loaded with the values QB(1)=1 and QB(0)=0. In this example, PV_EVALB 1116, and PV_STATE(N)=0 are not configured to switch during application of level 0 of the staircase program-verify pulse because it is the last level of the to be program-verified. When the staircase program-verify pulse 1005 has a value substantially within level 0, the D-latches 814 can clear, setting VER_LD high 1120. Because QB(1) is preset with the logic value "1," 1121, VER_LD 1120 switches high when QB(0) is set high 1122. With the data in the d-latches cleared ("1"), the r-input 805 remains off when PV_EVALB 1116 is switched. Accordingly, the s/r latch 802 does not reset; PV_ENABLE remains high, and VER_LD remains high, inhibiting further programming of the memory cell 603.

Although the schematic diagram of FIGS. 8–11 show a specific configuration and illustrate specific electrical and electronic components for the program-verify circuit, those skilled in the art will understand from the description of the schematic diagram and the following operation of the program-verify circuit that alternate or surrogate arrangements encompassing the principles of the present invention are contemplated. As heretofore mentioned, according to the present invention, a MLC flash memory device capable of reducing the time for programming and a method thereof can be obtained.

While particular embodiments of the present invention have been shown and described, modifications may be made. Those skilled in the art will recognize that the illustrated embodiments may be adapted for MLC flash memory designs of various sizes and configurations. It is therefore intended in the appended claims to cover all such changes and modifications that fall within the true spirit and scope of the invention.

What is claimed is:

1. A non-volatile semiconductor memory device, comprising:
   a memory array including a plurality of multi-level-cell memory cells, each memory cell comprising a storage element having a capacity to store N bits of logical data,
   where $N \geq 2$, and each memory cell configured for $2^N$ distinct data storage levels, each of the $2^N$ data storage levels representative of a discrete N-bit combination of logical data; and
   a staircase program-verify circuit for providing a staircase program-verify pulse electrically coupled to the memory array and capable of concurrently program-verifying the plurality of multi-level-cell memory cells and inhibiting programming of a memory cell programmed substantially within a selected data storage level.

2. The device of claim 1, wherein the storage element comprises a semiconductor transistor having a programmable threshold voltage, $V_t$, within a continuous range from a lowest $V_t$ value to a highest $V_t$ value, the continuous range having $2^N$ distinct data storage levels including an erased level and $2^N-1$ program levels, the $2^N-1$ program levels including a lowest program level, at least one intermediate program level, and a highest program level.

3. The device of claim 2 wherein the program-verify circuit is configured to apply a stepped-voltage pulse to the multi-level-cell memory cells and having $2^N-1$ steps, including an initial step, at least one intermediate step and a final step, the initial step having a value substantially within a $V_t$ level for the highest program level, the final step of the voltage pulse having a value substantially within a $V_t$ level for the lowest program level and the at least one intermediate step having a value substantially within a $V_t$ level for the at least one intermediate program level.

4. The device of claim 3 wherein the program-verify circuit is capable of inhibiting programming of a memory cell programmed substantially within a selected level subsequent to an application of a step of the stepped voltage pulse with a corresponding the selected level.

5. A method for program-verifying a multi-level-cell flash memory device having a plurality of memory cells each memory cell configured to store N bits of logical data where $N \geq 2$, the method comprising:
   programming a memory cell for N-bits of data, the memory cell having $2^N$ data storage levels, the $2^N$ data storage levels including an erased level and $2^N-1$ program levels, said $2^N-1$ program levels including a lowest level, $2^N-2$ intermediate levels and a highest level;
   loading the N-bits of data into a program-verify circuit, the program-verify circuit electrically coupled to the memory cell;
   generating a stepped voltage pulse having $2^N-1$ steps including an initial step, $2^N-2$ intermediate steps following the initial step in time and a final step following the $2^N-2$ intermediate steps in time, the initial step substantially equal to a program-verify voltage for the highest program level, the final substantially equal to a program verify voltage for the lowest program level and each of the $2^N-2$ intermediate steps substantially equal to a program-verify voltage corresponding an intermediate program level;
   applying the stepped voltage pulse to the memory cell to verify whether the memory cell is programmed to a data storage level;
   substantially concurrently with applying the stepped voltage pulse to the memory cell, verifying whether the memory cell is programmed to a data storage level for the N-bits data; and
   inhibiting application of a program pulse to a memory cell verified as programmed to the data storage level corresponding to the N-bits of data.

6. The method of claim 5 further comprising:
   applying the stepped voltage pulse to a plurality of memory cells, each memory cell being programmed to a distinct data storage level from other memory cells;
   substantially concurrently with applying the stepped voltage pulse to the plurality memory cells, verifying whether each memory cell is programmed to the distinct data storage level; and
   inhibiting application of a program pulse to each memory cell verified as programmed to the distinct data storage level.

7. An electrical circuit for program-verifying a multi-level-cell flash memory device comprising:
   a means for programming a memory cell for N bits of data, the memory cell having $2^N$ data storage levels, the $2^N$ data storage levels including an erased level and $2^N-1$ program levels, said $2^N-1$ program levels including a lowest level, $2^N-2$ intermediate levels and a highest level;
   a means for loading the N bits of data into a program-verify circuit, the program-verify circuit electrically coupled to the memory cell;
   a means for generating a stepped voltage pulse having $2^N-1$ steps including an initial step, $2^N-2$ intermediate steps following the initial step in time and a final step following the $2^N-2$ intermediate steps in time, the initial step substantially equal to a program-verify voltage for the highest program level, the final step substantially equal to a program-verify voltage for the lowest program level and each of the $2^N-2$ intermediate steps substantially equal to a program-verify voltage corresponding to an intermediate program level;

a means for applying the stepped voltage pulse to the memory cell to verify whether the memory cell is programmed to a data storage level;

a means for verifying whether the memory cell is programmed to a data storage level for the N bits of data substantially concurrently with applying the stepped voltage pulse to the memory cell; and a means for inhibiting application of a program pulse to a memory cell verified as programmed to the data storage level corresponding to the N bits of data.

8. The method of claim 7, further comprising:

a means for applying the stepped voltage pulse to a plurality of memory cells, each memory cell being programmed to a distinct data storage level from other memory cells;

a means for substantially concurrently with applying the stepped voltage pulse to the plurality memory cells, verifying whether each memory cell is programmed to the distinct data storage level; and a means for inhibiting application of a program pulse to each memory cell verified as programmed to the distinct data storage level.

* * * * *

Adverse Decision in Interference

Patent No. 6,538,923, Allan Parker, STAIRCASE PROGRAM VERIFY FOR MULTI-LEVEL CELL FLASH MEMORY DESIGNS, Interference No. 105,571, final judgment adverse to the patentees rendered August 2, 2007, as to claims 1 and 2.

*(Official Gazette July 29, 2008)*